US012757608B2

(12) United States Patent
Park et al.

(10) Patent No.: US 12,757,608 B2
(45) Date of Patent: Oct. 6, 2026

(54) DISPLAY DEVICE

(71) Applicant: SAMSUNG DISPLAY CO., LTD., Yongin-si (KR)

(72) Inventors: Yoon Kyoung Park, Seoul (KR); Jin Ho Kwack, Hwaseong-si (KR); Chang Mok Kim, Yongin-si (KR); Man Jae Park, Asan-si (KR); Seung Jae Lee, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 999 days.

(21) Appl. No.: 17/659,717

(22) Filed: Apr. 19, 2022

(65) Prior Publication Data

US 2022/0416200 A1 Dec. 29, 2022

(30) Foreign Application Priority Data

Jun. 22, 2021 (KR) ........................ 10-2021-0080651

(51) Int. Cl.

| | |
|---|---|
| ***H01L 51/54*** | (2006.01) |
| ***G06F 3/044*** | (2006.01) |
| ***H10K 59/40*** | (2023.01) |
| ***H10K 59/80*** | (2023.01) |
| ***H10K 85/10*** | (2023.01) |
| *H10K 59/122* | (2023.01) |

(52) U.S. Cl.

CPC ........... *H10K 59/40* (2023.02); *G06F 3/0445* (2019.05); *H10K 59/8731* (2023.02); *H10K 85/141* (2023.02); *H10K 85/151* (2023.02); *H10K 59/122* (2023.02)

(58) Field of Classification Search

None

See application file for complete search history.

(56) References Cited

U.S. PATENT DOCUMENTS

| | | | | |
|---|---|---|---|---|
| 10,553,662 | B2 | 2/2020 | Lee et al. | |
| 2011/0046314 | A1 | 2/2011 | Klipp et al. | |
| 2015/0364690 | A1* | 12/2015 | Nam | C09D 133/04 522/182 |
| 2017/0250358 | A1 | 8/2017 | Martin et al. | |
| 2019/0031822 | A1 | 1/2019 | Hayashi et al. | |
| 2019/0155428 | A1* | 5/2019 | Lee | G06F 3/047 |

FOREIGN PATENT DOCUMENTS

| | | |
|---|---|---|
| KR | 10-2019-0000553 | 1/2019 |
| KR | 10-2019-0064701 A | 6/2019 |
| KR | 10-2019-0073061 | 6/2019 |
| KR | 10-2020-0099537 | 8/2020 |
| WO | 2019123123 | 6/2019 |

OTHER PUBLICATIONS

Office Action dated Sep. 10, 2024, in related Korean Patent Application No. 10-2021-0080651, 12 pages, in Korean.

* cited by examiner

*Primary Examiner* — Andrew K Bohaty

(74) *Attorney, Agent, or Firm* — F. CHAU & ASSOCIATES, LLC

(57) ABSTRACT

A display device includes a substrate; a first electrode disposed on the substrate; a bank layer disposed on the substrate and including an opening exposing the first electrode; an emissive layer disposed on the first electrode exposed by the bank layer; a second electrode disposed on the bank layer and the emissive layer; an encapsulation layer disposed on the second electrode; and a touch layer disposed on the encapsulation layer, in which the encapsulation layer includes at least one inorganic film and at least one organic film, and in which the organic film contains organic molecules having an oval shape.

11 Claims, 15 Drawing Sheets

DISPLAY DEVICE

CROSS-REFERENCE TO RELATED APPLICATION(S)

This application claims priority under 35 U.S.C. § 119 to Korean Patent Application No. 10-2021-0080651, filed on Jun. 22, 2021, in the Korean Intellectual Property Office, the disclosure of which is incorporated by reference herein in its entirety.

TECHNICAL FIELD

The present disclosure relates to a display device, and more particularly, to a display device including a touch member.

DISCUSSION OF RELATED ART

Electronic devices, that provide images to a user such as, for example, a smart phone, a tablet PC, a digital camera, a laptop computer, a navigation device and a smart TV, include a display device for displaying images. Such a display device includes a display panel for generating and displaying images and various input means.

Recently, a touch panel that recognizes a touch input has been widely employed for the input means of a display device such as a smart phone or a tablet PC. The touch panel determines (recognizes) whether a touch input is received, and, if any, finds the coordinates of the position of the touch input. The touch panel comprises a plurality of sensing electrodes. The touch sensitivity may vary depending on the capacitance around the sensing electrodes. The capacitance between two sensing electrodes or between a sensing electrode and an adjacent conductive electrode (e.g., an electrode of a light emitting element) may be affected by the dielectric constant(s) of the dielectric material(s) interposed therebetween. Therefore, applying a dielectric material having an appropriate dielectric constant (e.g., a lower dielectric constant) between the sensing electrode and the adjacent conductive electrode so as to reduce capacitance and enhance touch sensitivity may be desirable.

SUMMARY

Embodiments of the present disclosure provide a display device that can enhance touch sensitivity.

According to an embodiment of the present disclosure, a display device includes a substrate; a first electrode disposed on the substrate; a bank layer disposed on the substrate and including an opening exposing the first electrode; an emissive layer disposed on the first electrode exposed by the bank layer; a second electrode disposed on the bank layer and the emissive layer; an encapsulation layer disposed on the second electrode; and a touch layer disposed on the encapsulation layer, in which the encapsulation layer includes at least one inorganic film and at least one organic film, and in which the organic film contains organic molecules having an oval shape, which are referred to as oval organic molecules.

According to an embodiment of the present disclosure, a display device includes a substrate; a first electrode disposed on the substrate; a bank layer disposed on the substrate and including an opening exposing the first electrode; an emissive layer disposed on the first electrode exposed by the bank layer; a second electrode disposed on the bank layer and the emissive layer; an encapsulation layer disposed on the second electrode; and a touch layer disposed on the encapsulation layer, in which the encapsulation layer comprises at least one inorganic film and at least one organic film, and in which the organic film contains organic molecules, in which the organic molecules have a following formula (1):

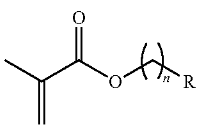

where n is a natural number equal to or greater than 12, and R denotes a methyl group or an acrylate group, and in which the organic molecules have a following formula (2):

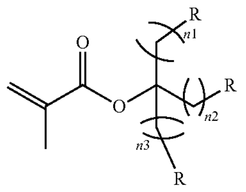

where each of n1, n2 and n3 is a natural number of 4 or more, and R denotes a methyl group or an acrylate group, and in which the organic molecules comprise at least two of three (n1, n2 and n3) alkyl chains.

According to an embodiment of the present disclosure, a display device includes a substrate; a first electrode disposed on the substrate; a bank layer disposed on the substrate and including an opening exposing the first electrode; an emissive layer disposed on the first electrode exposed by the bank layer; a second electrode disposed on the bank layer and the emissive layer; an encapsulation layer disposed on the second electrode; and a touch member comprising a touch layer disposed on the encapsulation layer, in which the encapsulation layer includes at least one inorganic film and at least one organic film, in which an absorbance of each of organic molecules of the organic film is measured in a first direction and in a second direction perpendicular to the first direction using a Fourier transform infrared spectrometer (FT-IR), and in which a ratio between the absorbance of the organic molecules in the first direction and the absorbance of the organic molecules in the second direction is equal to or greater than 1.4.

According to an embodiment of the present disclosure, a display device includes a substrate; a first electrode disposed on the substrate; a bank layer disposed on the substrate and including an opening exposing the first electrode; an emissive layer disposed on the first electrode exposed by the bank layer; a second electrode disposed on the bank layer and the emissive layer; an encapsulation layer disposed on the second electrode; and a touch layer disposed on the encapsulation layer, in which the encapsulation layer comprises at least one inorganic film and at least one organic film, in which the organic film contains organic molecules having one or both of formula (1) and formula (2), in which the formula (1) is:

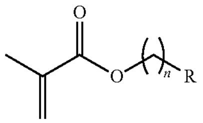

where n is a natural number equal to or greater than 12, and R denotes a methyl group or an acrylate group, in which the formula (2) is:

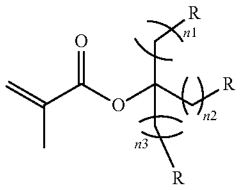

where each of n1, n2 and n3 is a natural number of 4 or more, and R denotes a methyl group or an acrylate group, and in which the organic molecules comprise at least two of three (n1, n2 and n3) alkyl chains.

According to an embodiment of the present disclosure, touch sensitivity can be enhanced.

It should be noted that embodiments of the present disclosure are not limited to those described above and other embodiments of the present disclosure will be apparent to those skilled in the art from the following descriptions.

BRIEF DESCRIPTION OF THE DRAWINGS

The above and other aspects and features of the present disclosure will become more apparent by describing in detail embodiments thereof with reference to the accompanying drawings, in which.

Figure 1:
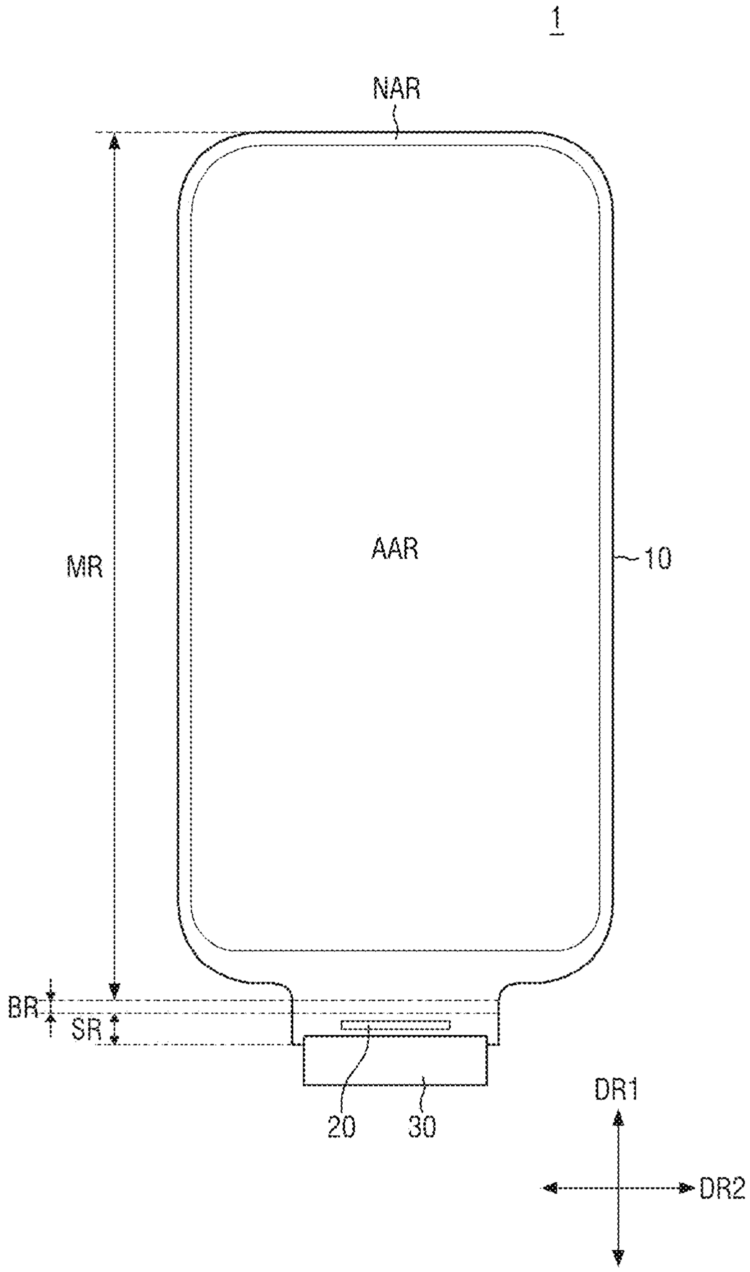
FIG. 1 is a plan view showing a layout of a display device according to an embodiment of the present disclosure.

Since the drawings in FIGS. 1-16 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Specific structural and functional descriptions of embodiments of the present disclosed are only for illustrative purposes of the embodiments of the present disclosure. The present disclosure may be embodied in many different forms without departing from the spirit and significant characteristics of the present disclosure. Therefore, the embodiments of the present disclosure are disclosed only for illustrative purposes and should not be construed as limiting the present disclosure.

It will be understood that when an element is referred to as being related to another element such as being “coupled” or “connected” to another element, it can be directly coupled or connected to the other element or intervening elements may be present therebetween. In contrast, it should be understood that when an element is referred to as being related to another element such as being “directly coupled” or “directly connected” to another element, there are no intervening elements present. Other expressions that explain the relationship between elements, such as “between”, “directly between”, “adjacent to” or “directly adjacent to” should be construed in the same way.

Throughout the specification, the same reference numerals will refer to the same or like parts.

It will be understood that, although the terms “first”, “second”, “third”, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, and vice versa without departing from the teachings herein.

The terminology used herein is for the purpose of describing particular embodiments only and is not intended to be limiting. As used herein, “a”, “an”, “the” and “at least one” do not denote a limitation of quantity, and are intended to include both the singular and plural, unless the context clearly indicates otherwise. For example, “an element” has the same meaning as “at least one element” unless the context clearly indicates otherwise. “At least one” is not to be construed as limiting “a” or “an”. “Or” means “and/or”. As used herein, the term “and/or” includes any and all combinations of one or more of the associated listed items. It will be further understood that the terms “comprises” and/or “comprising” or “includes” and/or “including” when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as “lower” or “bottom” and “upper” or “top” may be used herein to describe one element’s relationship to another element as illustrated in the drawings. It will be understood that relative terms are intended to encompass different orientations of the device in addition to the orientation depicted in the drawings. For example, if the device in one of the figures is turned over, elements described as being on the “lower” side of other elements would then be oriented on “upper” sides of the other elements. The exemplary term “lower” can therefore, encompasses both an orientation of “lower” and “upper” depending on the particular orientation of the figure. Similarly, if the device in one of the figures is turned over, elements described as “below” or “beneath” other elements would then be oriented “above” the other elements. The exemplary terms “below” or “beneath” can, therefore, encompass both an orientation of above and below.

The term “about” or “approximately” as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” or “approximately” may mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure are described herein with reference to cross section illustrations that are schematic illustrations of idealized embodiments. As such, variations from the shapes of the illustrations as a result, for example, of manufacturing techniques and/or tolerances, are to be expected. Thus, embodiments of the present disclosure described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present disclosure.

Hereinafter, embodiments of the present disclosure will be described with reference to the accompanying drawings.

Figure 2:
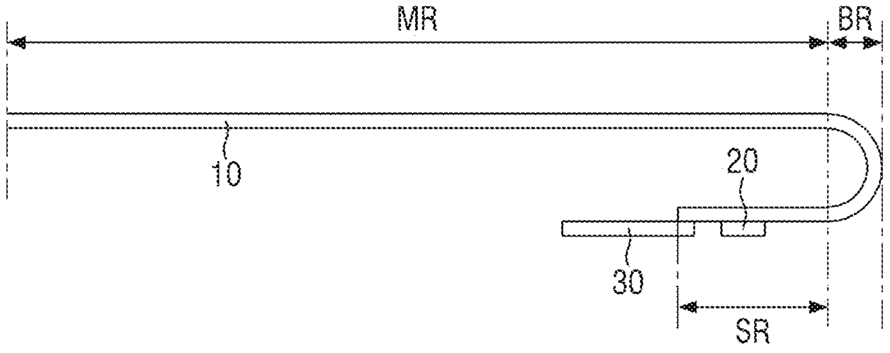
FIG. 2 is a cross-sectional view of a part of a display device according to an embodiment of the present disclosure.

FIG. 1 is a plan view showing a layout of a display device according to an embodiment of the present disclosure. FIG. 2 is a cross-sectional view of a part of a display device according to an embodiment of the present disclosure.

According to an embodiment of the present disclosure, a first direction D1 and a second direction D2 are different directions and they may intersect each other. For example, the first direction D1 may be perpendicular to the second direction D2. In the plan view of FIG. 1, the first direction DR1 is defined as the vertical direction and the second direction DR2 is defined as the horizontal direction for convenience of illustration. In the following description, a first side of the first direction DR1 indicates the upper side, a second side of the first direction DR1 indicates the lower side, a first side of the second direction DR2 indicates the right side, and a second side of the second direction DR2 indicates the left side when viewed from the top. It should be understood that the directions referred to in the embodiments of the present disclosure are relative directions, and the present disclosure is not limited to the directions mentioned.

Referring to FIGS. 1 and 2, a display device 1 may refer to any electronic device providing a display screen. The display device 1 may include portable electronic devices for providing a display screen, such as, for example, a mobile phone, a smart phone, a tablet personal computer (PC), an electronic watch, a smart watch, a watch phone, a mobile communications terminal, an electronic notebook, an electronic book, a portable multimedia player (PMP), a navigation device, a game console and a digital camera, as well as a television set, a laptop computer, a monitor, an electronic billboard, the Internet of Things devices, etc.

The display device 1 includes an active area AAR and a non-active area NAR. In the display device 1, a display area may be defined as the area where images are displayed, a non-display area may be defined as the area where no image is displayed, and a touch area may be defined as the area where a touch input is sensed. Then, the display area and the touch area may be included in the active area AAR. The display area and the touch area may overlap each other. That is, in the active area AAR, images are displayed and a touch input is sensed as well.

The shape of the active area AAR may be a rectangle or a rectangle with rounded corners. In the example shown, the shape of the active area AAR is a rectangle that has rounded corners and has its sides in the first direction DR1 longer than its sides in the second direction DR2. It is, however, to be understood that the present disclosure is not limited thereto. For example, the active area AAR may have various shapes such as a rectangular shape with its sides in the second direction DR2 longer than its sides in the first direction DR1, a square shape, other polygonal shapes, a circular shape, and an oval shape.

The non-active area NAR is disposed around the active area AAR. The non-active area NAR may be a bezel area. The non-active area NAR may surround all sides (four sides in the drawings) of the active area AAR. It is, however, to be understood that the present disclosure is not limited thereto. For example, the non-active area NAR may not be disposed near the upper side of the active area AAR or near the left or right side thereof.

In the non-active area NAR, signal lines for applying signals to the active area AAR (e.g., the display area and/or the touch area) or driving circuits may be disposed. The non-active area NAR may include no display area. Further, the non-active area NAR may include no touch area. In an embodiment of the present disclosure, the non-active area NAR may include a part of the touch area, and a sensor member such as a pressure sensor may be disposed in that part. In an embodiment of the present disclosure, the active area AAR may be completely identical to the display area where images are displayed, while the non-active area NAR may be completely identical to the non-display area where no image is displayed.

The display device 1 includes a display panel 10 for providing a display screen. Examples of the display panel 10 may include an organic light-emitting display panel, a micro light emitting diode (LED) display panel, a nano LED display panel, a quantum-dot light emitting display panel, a liquid-crystal display panel, a plasma display panel, a field emission display panel, an electrophoretic display panel, an electrowetting display panel, etc. In the following description, an organic light-emitting display panel is employed as an example of the display panel 10, but the present disclosure is not limited thereto. Any other display panel may be employed as long as the technical idea of the present disclosure can be equally applied.

The display panel 10 may include a plurality of pixels. The plurality of pixels may be arranged in a matrix shape. However, the present disclosure is not limited thereto. For example, the pixels may be arranged in a pentile matrix shape, or a diamond shape. The shape of each pixel may be, but is not limited to, a rectangle or a square when viewed from the top. Each pixel may have a diamond shape having sides inclined with respect to the first direction DR1. Each pixel may include an emission area. Each emission area may have a shape the same as or different from the shape of the pixels. For example, when the pixels have a rectangular shape, the shape of the emission area of each of the pixels may have various shapes such as, for example, a rectangle, a diamond, a hexagon, an octagon, an oval and a circle. The pixels and the emission areas will be described in detail later.

The display device 1 may further include a touch member for sensing a touch input. The touch member may be implemented as a panel or film separated from the display panel 10 to be attached on the display panel 10 or may be implemented in the form of a touch layer inside the display panel 10. Although the touch member is provided inside the display panel to be included in the display panel 10 in the following description, it is to be understood that the present disclosure is not limited thereto. In an embodiment of the present disclosure, the touch member is integrated into the display panel 10, and a touch panel, a touch film, etc. other than the integrated touch member may be further added to the display panel 10.

The display panel 10 may include a flexible substrate including a flexible polymer material such as polyimide (PI). Accordingly, the display panel 10 may be curved, bent, folded, or rolled. Accordingly, the display panel 10 may be used to form a bent display device, a curved display device, a foldable display device, or a rollable display device.

The display panel 10 may include a bending region BR where the display panel 10 is bent. The display panel 10 may be divided into a main region MR located on one side of the bending region BR and a subsidiary region SR located on the other side of the bending region BR.

The display area of the display panel 10 is located in the main region MR. According to an embodiment of the present disclosure, the edge portions of the display area in the main region MR, the entire bending region BR and the entire subsidiary region SR may be the non-display area. It is, however, to be understood that the present disclosure is not limited thereto. For example, the bending region BR and/or the subsidiary region SR may also include the display area. That is, the display area of the display panel 10 may be located in the main region MR and at least some portion of the bending region BR and/or the subsidiary region SR.

The bending region BR is connected to one side of the main region MR in the first direction DR1. The main region MR may have a rectangular shape with a long side extending in the first direction DR1, and a short side extending in the second direction DR2. For example, the bending region BR may be connected to the lower short side of the main region MR. The width of the bending region BR may be less than the width (width of the short side) of the main region MR. The portions where the main region MR meets the bending region BR may be cut in an L-shape when viewed from the top.

In the bending region BR, the display panel 10 may be bent downward in the thickness direction, i.e., in the direction away from the display surface. Although the bending region BR may have a constant radius of curvature, the present disclosure is not limited thereto. For example, it may have different radii of curvature for different sections. As the display panel 10 is bent at the bending region BR, the surface of the display panel 10 may be reversed. For example, the surface of the display panel 10 facing upward may be bent such that it faces outward at the bending region BR and then faces downward. After bending, the main region MR may face upward, the bending region BR may face outward, and the subsidiary region SR may face downward.

The subsidiary region SR is extended from the bending region BR. The subsidiary region SR may be extended in a direction parallel to the main region MR from the end of the bending region. The subsidiary region SR may overlap with the main region MR in the thickness direction of the display panel 10. The width of the subsidiary region SR (the width in the second direction DR2) may be, but is not limited to being, equal to the width of the bending region BR. In an embodiment of the present disclosure, the width of the bending region BR may be gradually reduced, and may be the same as the width of the subsidiary region SR where the bending region BR and the subsidiary region SR meet each other. Alternatively, in an embodiment of the present disclosure, the width of the bending region BR may be greater than the width of the subsidiary region SR, or in an embodiment of the present disclosure, the width of the bending region BR may be smaller than the width of the subsidiary region SR where the bending region BR and the subsidiary region SR meet each other.

A driver chip 20 may be disposed in the subsidiary region SR. The driver chip 20 may include an integrated circuit which outputs signals and voltages for driving the display panel 10. The integrated circuit may include an integrated circuit for a display and/or an integrated circuit for a touch unit. The integrated circuit for a display and the integrated circuit for a touch unit may be provided as separate chips or may be integrated into a single chip.

A pad area may be disposed at the end of the subsidiary region SR of the display panel 10. The pad area may include display signal line pads and touch signal line pads. For example, the driver chip 20 may be connected to the display signal line pads and touch signal line pads of the pad area. A drive circuit board 30 may be connected to the pad area at the end of the subsidiary region SR of the display panel 10. The drive circuit board 30 may be a flexible printed circuit board (FPCB) or a film.

Figure 3:
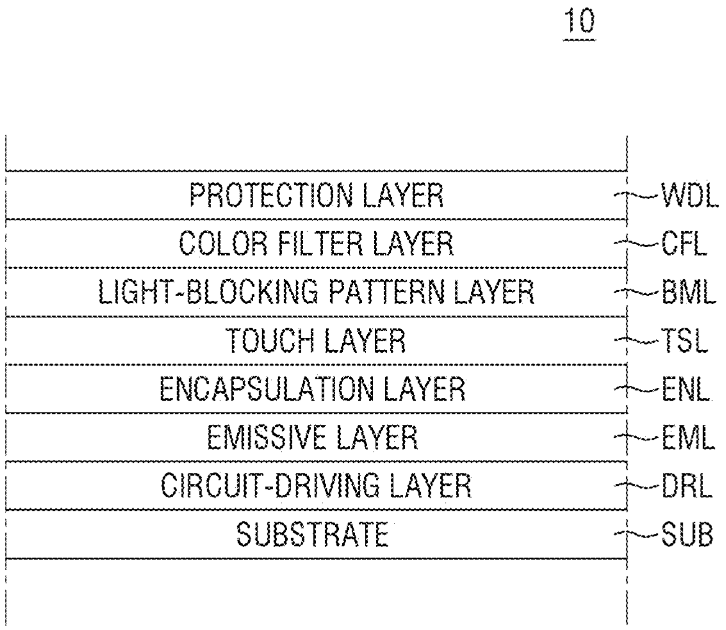
FIG. 3 is a cross-sectional view showing an example of a stack structure of a display panel according to an embodiment of the present disclosure.

FIG. 3 is a cross-sectional view showing an example of a stack structure of a display panel according to an embodiment of the present disclosure.

Referring to FIG. 3, the display panel 10 may include a circuit-driving layer DRL disposed on a substrate SUB. The circuit-driving layer DRL may include a circuit for driving an emissive layer EML of each pixel. The circuit-driving layer DRL may include a plurality of thin-film transistors.

The emissive layer EML may be disposed on the circuit-driving layer DRL. The emissive layer EML may include an organic light emitting layer. The emissive layer EML may emit light with various luminances depending on driving signals transmitted from the circuit-driving layer DRL.

The encapsulation layer ENL may be disposed on the emissive layer EML. The encapsulation layer ENL may include an inorganic film or a stack of an inorganic film and an organic film. The organic film may be interposed between two adjacent inorganic films, and may have a substantially flat upper surface. As another example, glass or an encapsulation film may be employed as the encapsulation layer ENL.

The touch layer TSL may be disposed on the encapsulation layer ENL. The touch layer TSL may sense a touch input and may perform the functions of the touch member. The touch layer TSL may include a plurality of sensing regions and sensing electrodes. For example, the touch layer TSL may include sensing electrodes for sensing a user's touch by capacitive sensing such as a self-capacitive sensing or a mutual capacitive sensing.

A light-blocking pattern layer BML may be disposed on the touch layer TSL. The light-blocking pattern layer BML can suppress reflection of external light and may enhance the color of the reflected light.

A color filter layer CFL may be disposed on the light-blocking pattern layer BML. The color filter layer CFL can reduce the reflection of external light. The color filter layer CFL may include a red color filter, a green color filter, and a blue color filter. The color filters may be disposed in the pixels, respectively. For example, the color filter layer CFL may include a red color filter for transmitting light of a red wavelength region, a green color filter for transmitting light of a green wavelength region, and a blue color filter for transmitting light of a blue wavelength region. The color filters disposed in the pixels can enhance color purity of lights emitted from the emission areas of the respective pixels. Although the color filter layer CFL and the light-blocking pattern layer BML are separate layers in the example shown in FIG. 3, the present disclosure is not limited thereto. For example, in an embodiment of the present disclosure, the light-blocking pattern layer BML may be included in the color filter layer CFL. For example, the light-blocking pattern layer BML may include light-blocking patterns disposed between the adjacent color filters, and the color filter layer CFL may include the light-blocking patterns.

According to an embodiment of the present disclosure, the color filter layer CFL is disposed on the light-blocking pattern layer BML to reduce the reflection of external light in the display device 1, and the front transmittance of the light emitted from the emissive layer EML can be enhanced compared to a display device in which a polarizing member is disposed on the light-blocking pattern layer BML.

A protection layer WDL may be disposed on the color filter layer CFL. The protection layer WDL may include, for example, a window member. The window member may protect the touch layer TSL from an external scratch and impact. The window member may be formed of an insulating material such as, for example, glass, quartz, and/or a polymer resin. The protection layer WDL may be attached on the color filter layer CFL by an optically clear adhesive or the like.

Hereinafter, the touch member will be described in detail.

Figure 4:
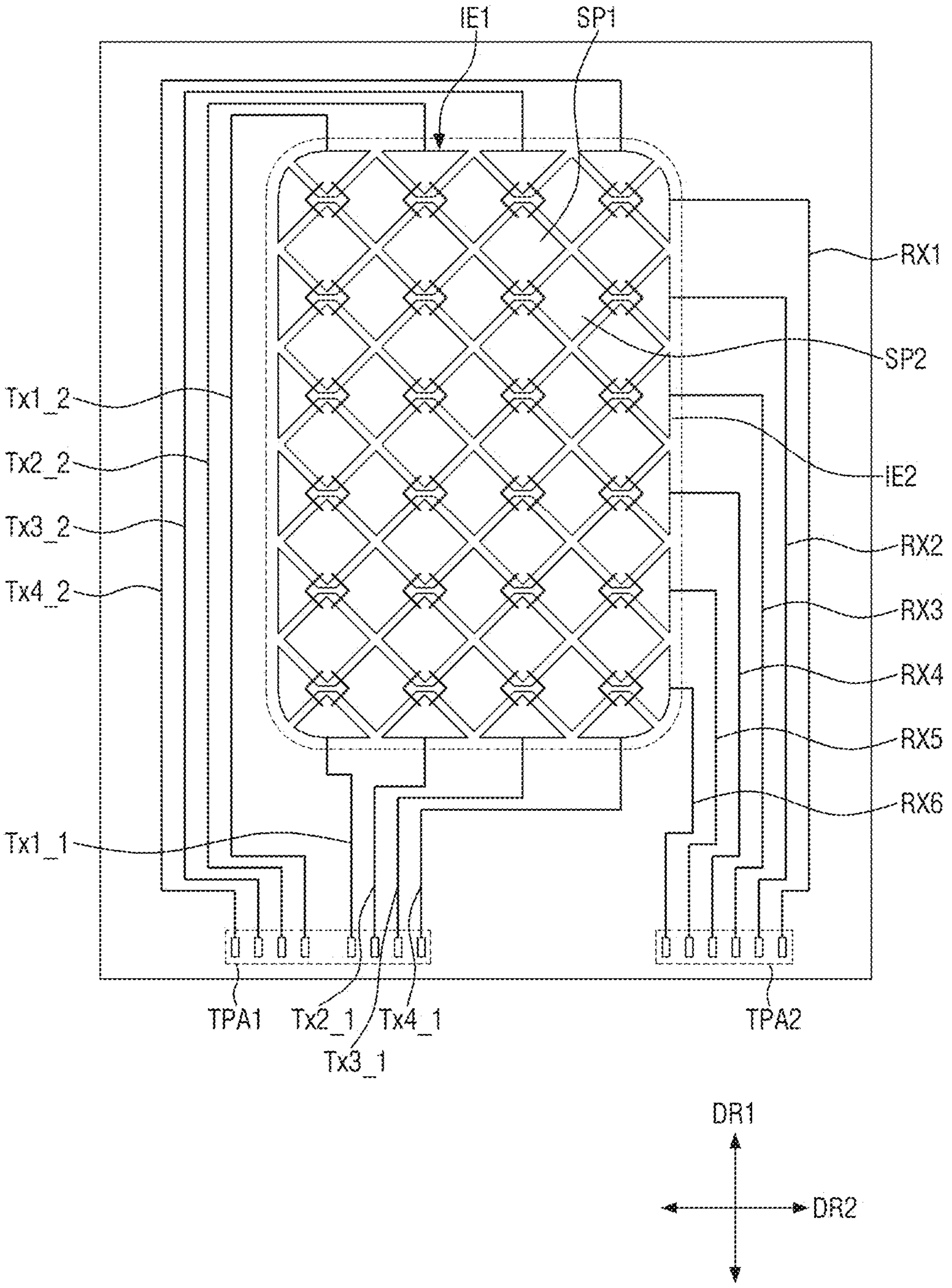
FIG. 4 is a schematic plan view of a touch member according to an embodiment of the present disclosure.

FIG. 4 is a schematic plan view of a touch member according to an embodiment of the present disclosure.

Referring to FIG. 4, the touch member may include a touch region located in the active area AAR and a non-touch region located in the non-active area NAR. Although the touch member is simplified while the non-touch region is exaggerated in FIG. 4 for convenience of illustration, the shape of the touch region and the shape of the non-touch region may be substantially identical to those of the active area AAR and the non-active area NAR described above. The touch region may overlap the active area AAR of the display panel 10, and the non-touch region may overlap the non-active area NAR of the display panel 10. For example, the touch region may have a rectangular shape with four rounded corners when viewed from the top.

The touch region of the touch member may include a plurality of first sensing electrodes IE1 (or first touch electrodes) and a plurality of second sensing electrodes IE2 (or second touch electrodes). The first sensing electrodes IE1 or the second sensing electrodes IE2 may be driving electrodes and the others may be sensing electrodes. In this embodiment, the first sensing electrodes IE1 are driving electrodes while the second sensing electrodes IE2 are sensing electrodes.

The first sensing electrodes IE1 may extend in the first direction DR1. The first sensing electrodes IE1 may include a plurality of first sensor portions SP1 arranged in the first direction DR1 and the first connecting portions CP1 electrically connecting between adjacent ones of the first sensor portions SP1.

The plurality of first sensing electrodes IE1 may be arranged in the second direction DR2.

The second sensing electrodes IE2 may extend in the second direction DR2. The second sensing electrodes IE2 may include a plurality of second sensor portions SP2 arranged in the second direction DR2 and the second connecting portions CP2 electrically connecting between adjacent ones of the second sensor portions SP2. The plurality of second sensing electrodes IE2 may be arranged in the first direction DR1. The first sensing electrodes IE1 and the second sensing electrodes IE2 may cross each other.

Although the four first sensing electrodes IE1 and the six second sensing electrodes IE2 are arranged in the drawing, it is to be understood that the numbers of the first sensing electrodes IE1 and the second sensing electrodes IE2 are not limited to the above numerical values. Also, although the number of the first sensing electrodes IE1 is shown to be smaller than the number of the second sensing electrodes IE2, but the present disclosure is not limited thereto. For example, the number of the first sensing electrodes IE1 may be larger than the number of the second sensing electrodes IE2.

At least some of the first sensor portions SP1 and the second sensor portions SP2 may have a diamond shape. Some of the first sensor portions SP1 and the second sensor portions SP2 may have a truncated diamond shape. For example, all of the first sensor portions SP1 and the second parts SP2 except the first and last ones in the extension direction may have a diamond shape, and each of the first and last ones in the extension direction may have a triangle shape obtained by cutting the diamond shape. The first sensor portions SP1 and the second sensor portions SP2 in the diamond shape may have substantially the same size and shape. The first sensor portions SP1 and the second sensor portions SP2 in the triangle shape may have substantially the same size and shape. It is, however, to be understood that the present disclosure is not limited thereto. For example, the first sensor portions SP1 and the second sensor portions SP2 may have a variety of shapes and sizes.

Figure 5:
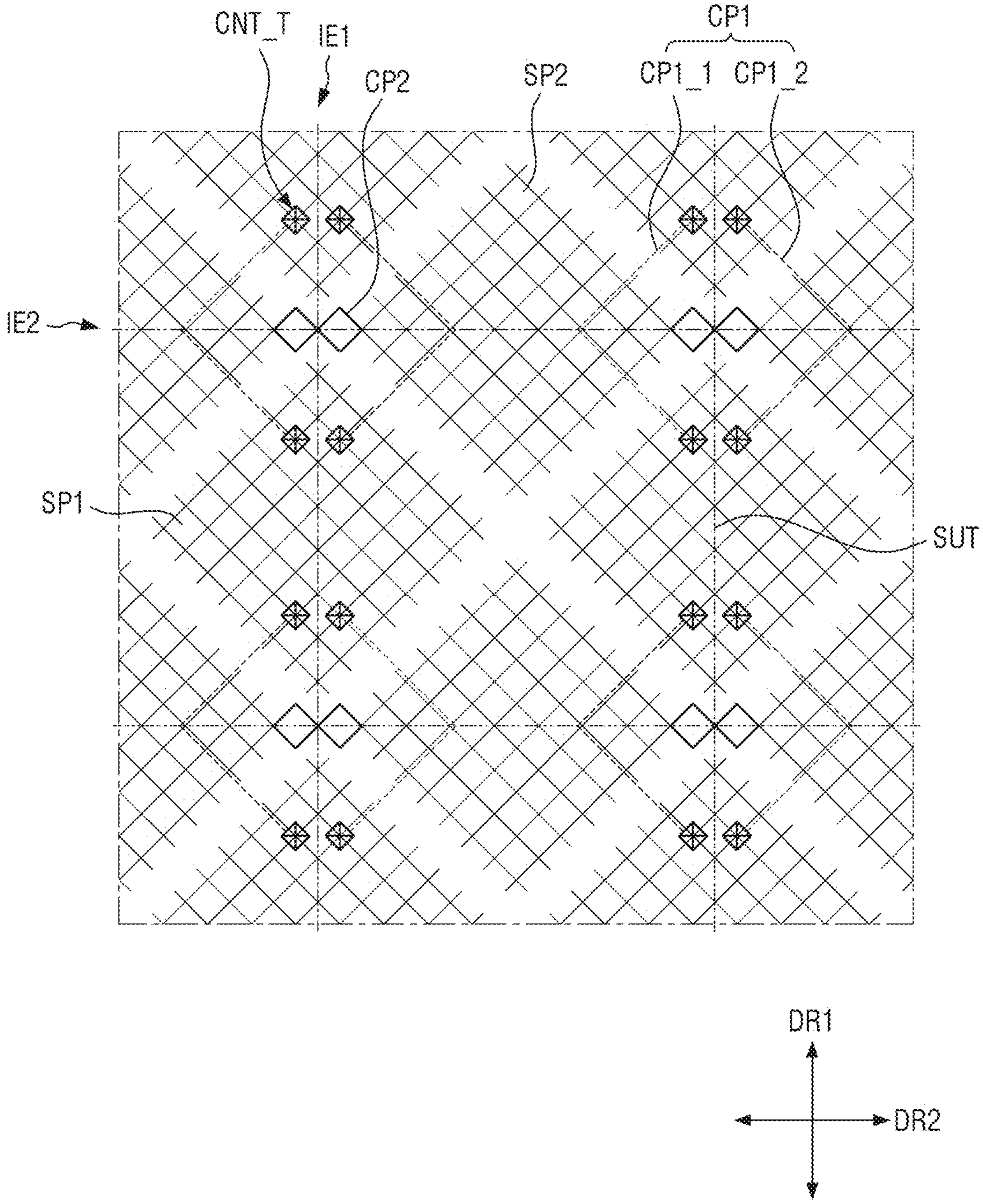
FIG. 5 is an enlarged view of a part of the touch region of FIG. 4.
Figure 7:
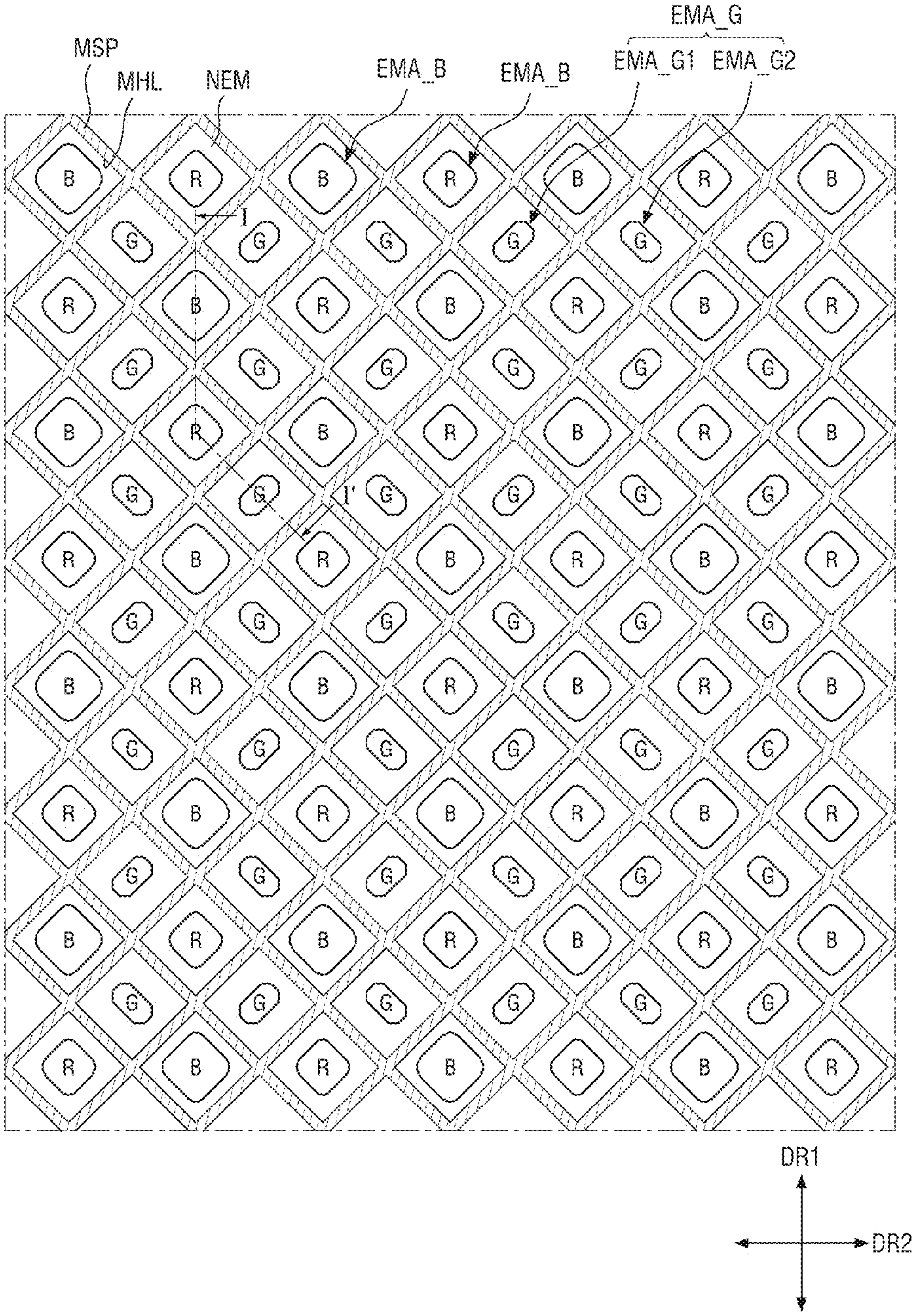
FIG. 7 is a diagram showing the relative arrangement relationship between the pixels and the touch member in a mesh pattern in the display area according to an embodiment of the present disclosure.

The first sensor portions SP1 of the first sensing electrodes IE1 and the second sensor portions SP2 of the second sensing electrodes IE2 may each include a planar pattern or a mesh pattern. When the first sensor portions SP1 and the second sensor portions SP2 include a planar pattern, the first sensor portions SP1 and the second sensor portions SP2 may be formed as a transparent conductive layer. The first sensor portions SP1 and the second sensor portions SP2 including the transparent conductive layer are not viewed by a user compared to the first sensor portions SP1 and the second sensor portions SP2 including a metal layer. Thus, to prevent the first sensor portions SP1 and the second sensor portions SP2 including the metal layer from being viewed by a user, the first sensor portions SP1 and the second sensor portions SP2 including the metal layer may have a mesh pattern. The mesh-shaped first sensor portions SP1 and the mesh-shaped second sensor portions SP2 may increase flexibility and reduce noise on the display panel 10. When the first sensor portions SP1 and the second sensor portions SP2 include a mesh pattern disposed along the non-emission areas as illustrated in FIGS. 5 and 7, it is possible to employ an opaque, low-resistance metal without interfering with the propagation of the emitted light. In the following description, the first sensor portions SP1 and the second sensor portions SP2 each include a mesh pattern. It is, however, to be understood that the present disclosure is not limited thereto.

Each of the first connecting portions CP1 may connect a vertex of the diamond or triangle shape of a first sensor portion SP1 with that of an adjacent first sensor portion SP1. Each of the second connecting portions CP2 may connect a vertex of the diamond or triangle shape of a second sensor portion SP2 with that of an adjacent second sensor portion SP2. The width of the first connecting portions CP1 and the second connecting portions CP2 may be smaller than the width of the first sensor portions SP1 and the second sensor portions SP2.

The first sensing electrodes IE1 and the second sensing electrodes IE2 may be insulated from each other and intersect each other. The first sensing electrodes IE1 are connected to one another by a conductive layer and the second sensing electrodes IE2 are connected to one another by another conductive layer disposed on a different layer at the intersections, such that the first sensing electrodes IE1 can be insulated from the second sensing electrodes IE2. The first sensing electrodes IE1 can be connected to one another by the first connecting portions CP1 while the second sensing electrodes IE2 can be connected to one another by the second connecting portions CP2, so that they can be insulated from each other while intersecting each other. To do so, the first connecting portions CP1 and/or the second connecting portions CP2 may be located on a different layer from the first sensing electrode IE1 and the second sensing electrode IE2.

The first sensor portions SP1 of the first sensing electrodes IE1 and the second sensor portions SP2 of the second sensing electrodes IE2 may be formed as a conductive layer located on the same layer, and the first sensor portions SP1 and the second sensor SP2 may neither intersect nor overlap with each other. The adjacent ones of the first sensor portions SP1 and second sensor portions SP2 may be physically separated from each other.

The second connecting portions CP2 may be formed as the same conductive layer as the second sensor portions SP2 and may connect the adjacent ones of the second sensor portions SP2. A first sensor portion SP1 of a first sensing electrode IE1 is physically separated from an adjacent sensor portion SP1 thereof with respect to the area where a second connecting portion CP2 passes. The first connecting portions CP1 connecting the first sensor portions SP1 with one another may be formed as a different conductive layer from the first sensor portions SP1 and may traverse the area of the second sensing electrodes IE2. Each of the first connecting portions CP1 may be electrically connected to the respective first sensor portions SP1 by a contact. For example, the first connecting portion CP1 and the first sensor portion SP1 may be electrically connected to each other through a contact hole CNT_T (see FIG. 6), which is to be described, formed in an insulating layer disposed between the first connecting portion CP1 and the first sensor portion SP1.

There may be more than one first connecting portions CP1. For example, although not limited thereto, each of the first connecting portions CP1 may include a first connecting portion CP1_1 which overlaps an adjacent second sensing electrode IE2 on one side, and another first connecting portion CP1_2 which overlaps another adjacent second sensing electrode IE2 on the other side. As more than one first connecting portions CP1 connect between two adjacent ones of the first sensor portions SP1, disconnection of the first sensing electrodes IE1 may be prevented even if any of the first connecting portions CP1 is broken by static electricity or the like.

The first sensor portions SP1 and the second sensor portions SP2 adjacent to each other may form a unit sensing area SUT (see FIG. 5). For example, halves of two adjacent first sensor portions SP1 and halves of two adjacent second sensor portions SP2 may form a square or a rectangle, with respect to the intersection between the first sensing electrodes IE1 and the second sensing electrodes IE2. The area defined by the halves of the adjacent two first sensor portions SP1 and halves of the two adjacent second sensor portions SP2 may be a unit sensing area SUT. A plurality of sensing units SUT may be arranged in row and column directions.

In each of the sensing units SUT, the capacitance value between the adjacent first sensor portions SP1 and the second sensor portions SP2 is measured to determine whether or not a touch input is made, and if so, the position may be obtained as touch input coordinates. For example, a touch may be sensed by, for example, measuring mutual capacitance. In the following description, it is assumed that a touch is sensed by the mutual capacitive sensing. In this embodiment, the first sensing electrodes IE1 are driving electrodes while the second sensing electrodes IE2 are sensing electrodes. Therefore, due to the first connecting portions CP1, the driving electrodes (e.g., first sensing electrodes IE1) and the sensing electrodes (e.g., second sensing electrodes IE2) may be electrically separated at their intersections, and mutual capacitance may be formed between the driving electrodes (e.g., first sensing electrodes IE1) and the sensing electrodes (e.g., second sensing electrodes IE2). The touch sensitivity by the touch sensing in the unit sensing area SUT may be proportional to the measured capacitance between the first sensor portion SP1 and the second sensor portion SP2 adjacent to each other in the unit sensing area SUT and may be inversely proportional to the capacitance between the first sensor portion SP1 and the second sensor portion SP2 and the conductive layers located under the second touch conductive layer 220 (see FIG. 6) in the unit sensing area SUT. The capacitance between the first sensor portion SP1 and the second sensor portion SP2 and the conductive layers located under the second touch conductive layer 220 (see FIG. 6) in the unit sensing area SUT may be a noise signal level of the touch sensitivity. The capacitance between the first sensor portion SP1 and the second sensor portion SP2 and the conductive layers located under the second touch conductive layer 220 (see FIG. 6) in the unit sensing area SUT may also be referred to as a base capacitance. To increase the touch sensitivity by the touch sensing in the unit sensing area SUT, it may be contemplated to reduce the noise signal level of the touch sensitivity, rather than the measured capacitance between the adjacent first sensor portion SP1 and second sensor portion SP2 in the unit sensing area SUT which has a constant value. A detailed description thereon will be given later.

Each unit sensing area SUT may be larger than the size of a pixel. For example, each unit sensing area SUT may have an area equal to the area occupied by a plurality of pixels. The length of a side of the unit sensing area SUT may be in the range of, but is not limited to, 4 to 5 mm.

A plurality of touch signal lines is disposed in the non-active area NAR outside the touch region. The touch signal lines may extend from the touch signal line pads TPA1 and TPA2 located in the subsidiary region SR to the non-active area NAR of the main region MR through the bending region BR. A pad area may be disposed at the end of the subsidiary region SR of the display panel 10, and may include display signal line pads and touch signal line pads TPA1 and TPA2.

The touch signal lines include touch driving lines and touch sensing lines.

The touch driving lines are connected to the first sensing electrodes IE1. In an embodiment of the present disclosure, a plurality of touch driving lines may be connected to a single first sensing electrode IE1. For example, the touch driving lines may include first touch driving lines TX1_1, TX2_1, TX3_1 and TX4_1 connected to the lower end of the first sensing electrodes IE1, and second touch driving lines TX1_2, TX2_2, TX3_2 and TX4_2 connected to the upper end of the first sensing electrodes IE1. The first touch driving lines TX1_1, TX2_1, TX3_1 and TX4_1 may extend from touch signal line pads TPA1 as indicated by the upper arrow in the first direction DR1 and may be connected to the lower end of the first sensing electrodes IE1. The second touch driving lines TX1_2, TX2_2, TX3_2 and TX4_2 may extend from the touch signal line pads TPA1 as indicated by the upper arrow in the first direction DR1 and may go along the left edge of the touch region to be connected to the upper end of the first sensing electrodes IE1.

The touch sensing lines are connected to the second sensing electrodes IE2. In an embodiment of the present disclosure, a single touch sensing line may be connected to a single second sensing electrode IE2. The touch sensing lines RX1, RX2, RX3, RX4, RX5 and RX6 may extend from touch signal line pads TPA2 as indicated by the upper arrow in the first direction DR1 and may go along the right edge of the touch region to be connected to the right end of the second sensing electrodes IE2. Since the first sensing electrodes IE1 are longer than the second sensing electrodes IE2, a voltage drop of a detection signal (or a transmission signal) occurs and thus sensing sensitivity may be reduced. According to the present embodiment, a detection signal (or a transmission signal) is provided through the first touch driving lines TX1_1, TX2_1, TX3_1 and TX4_1 and the second touch driving lines TX1_2, TX2_2, TX3_2 and TX4_2 connected to two opposite ends of the first sensing electrodes IE1, a voltage drop of a detection signal (or a transmission signal) may be prevented and thus reduction of sensing sensitivity may be prevented.

Figure 6:
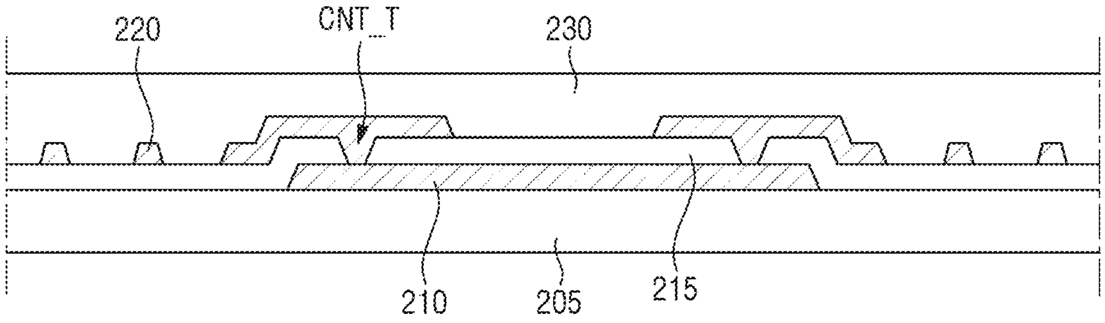
FIG. 6 is a cross-sectional view of a region including a contact hole between the first touch conductive layer and the second touch conductive layer of FIG. 5.

FIG. 5 is an enlarged view of a part of the touch region of FIG. 4. FIG. 6 is a cross-sectional view of a region including a contact hole between the first touch conductive layer and the second touch conductive layer of FIG. 5.

Referring to FIGS. 4 to 6, the touch member may include a base layer 205, a first touch conductive layer 210 disposed on the base layer 205, a first touch insulating layer 215 disposed on the first touch conductive layer 210, a second touch conductive layer 220 disposed on the first touch insulating layer 215 and a second touch insulating layer 230 covering the second touch conductive layer 220. For example, the first touch insulating layer 215 may be disposed between the first touch conductive layer 210 and the second touch conductive layer 220, and the first touch conductive layer 210 may be disposed between a second inorganic film 193 to be described (see FIG. 8) and the first touch insulating layer 215.

The first touch conductive layer 210 is disposed on the base layer 205. The first touch conductive layer 210 is covered by the first touch insulating layer 215. The first touch insulating layer 215 insulates the first touch conductive layer 210 from the second touch conductive layer 220. The second touch conductive layer 220 is disposed on the first touch insulating layer 215. The second touch insulating layer 230 covers and protects the second touch conductive layer 220.

The base layer 205 may include an inorganic insulating material. For example, the base layer 205 may include, for example, a silicon nitride ($Si_3N_4$) layer, a silicon oxynitride (SiON) layer, a silicon oxide ($SiO_2$) layer, a titanium oxide ($TiO_2$) layer, or an aluminum oxide ($Al_2O_3$) layer. In an embodiment of the present disclosure, the base layer 205 may be replaced with a second inorganic film 193 forming a thin encapsulation layer to be described later.

Each of the first touch conductive layer 210 and the second touch conductive layer 220 may include a metal or a transparent conductive layer. The metal may include, for example, aluminum (Al), titanium (Ti), copper (Cu), molybdenum (Mo), silver (Ag), or an alloy thereof. The transparent conductive layer may include a transparent conductive oxide such as, for example, indium tin oxide (ITO), indium zinc oxide (IZO), zinc oxide ($ZnO_2$) and indium tin zinc oxide (ITZO), a conductive polymer such as poly(3,4-ethylenedioxythiophene) (PEDOT), metal nanowire, graphene, etc. As described above, when the first touch conductive layer 210 and the second touch conductive layer 220 are disposed on the non-emission area, they do not interfere with the propagation of the emitted light even if they are an opaque, low-resistance metal. When the first touch conductive layer 210 and the second touch conductive layer 220 include a planar pattern, the first touch conductive layer 210 and the second touch conductive layer 220 may be formed as a transparent conductive layer. To prevent the first touch conductive layer 210 and the second touch conductive layer 220 including the opaque, low-resistance metal layer from being viewed by a user, the first touch conductive layer 210 and the second touch conductive layer 220 including the metal layer may have a mesh pattern.

The first touch conductive layer 210 and/or the second touch conductive layer 220 may include a multi-layered conductive layer, for example, may include at least two layers among transparent conductive layers and metal layers. For example, the first touch conductive layer 210 and/or the second touch conductive layer 220 may have a three-layered structure of titanium/aluminum/titanium (Ti/Al/Ti).

In an embodiment of the present disclosure, the first connecting portions CP1 may be formed as the first touch conductive layer 210 while the first sensor portions SP1, the second sensor portions SP2 and the second connecting portions CP2 may be formed as the second touch conductive layer 220. It is, however, to be understood that the present disclosure is not limited thereto. For example, on the contrary, the first connecting portions CP1 may be formed as the second touch conductive layer 220 while the sensor portions SP1 and SP2 and the second connecting portions CP2 may be formed as the first touch conductive layer 210. The touch signal lines may be formed as either the first touch conductive layer 210 or the second touch conductive layer 220. Alternatively, they may be formed as the first touch conductive layer 210 and the second touch conductive layer 220 connected by a contact. Besides, the touch conductive layers forming the elements of the sensing electrodes and the signal lines may be modified in a variety of ways. By using two layers (e.g., the first touch conductive layer 210 and the second touch conductive layer 220) of the sensing electrodes such as the first sensing electrodes IE1 and the second sensing electrodes IE2, a resistance of each of the sensing electrodes may be lowered, and the insulation between the first sensing electrodes IE1 and the second sensing electrodes IE2 may be properly maintained.

The first touch insulating layer 215 and the second touch insulating layer 230 may include an inorganic material or an organic material. In an embodiment of the present disclosure, the first touch insulating layer 215 or the second touch insulating layer 230 may include an inorganic material and the other may include an organic material. According to an embodiment of the present disclosure, the first touch insulating layer 215 may include, for example, a silicon nitride ($Si_3N_4$) layer, a silicon oxynitride (SiON) layer, a silicon oxide ($SiO_2$) layer, a titanium oxide ($TiO_2$) layer, a zirconium oxide ($ZrO_2$) layer, a hafnium oxide ($HfO_2$) layer or an aluminum oxide ($Al_2O_3$) layer. The second touch insulating layer 230 may include at least one of, for example, an acrylic resin, a methacrylic resin, a polyisoprene, a vinyl resin, an epoxy resin, a urethane resin, a cellulose resin, a siloxane resin, a polyimide resin, a polyamide resin or a phenolic resin.

The first touch insulating layer 215 may include a contact hole CNT_T. The first touch conductive layer 210 (e.g., the first connecting portion CP1) and a part of the second touch conductive layer 220 (e.g., the first sensor portion SP1) may be electrically connected to each other through the contact hole CNT_T.

FIG. 7 is a diagram showing the relative arrangement relationship between the pixels and the touch member in a mesh pattern in the display area according to an embodiment of the present disclosure.

Referring to FIG. 7, the display area of the active area AAR includes a plurality of pixels. The pixels include emission areas EMA_R, EMA_B and EMA_G. The emission areas EMA_R, EMA_B and EMA_G overlap with openings of the bank layer 126 and may be defined thereby. A non-emission area NEM is disposed between the emission areas EMA_R, EMA_B and EMA_G of the pixels, and overlaps with the bank layer 126 and may be defined thereby. The non-emission area NEM may surround the emission areas EMA_R, EMA_B and EMA_G. The non-emission area NEM has a lattice shape or a mesh shape arranged along the diagonal directions intersecting with the first direction DR1 and the second direction DR2 when viewed from the top. A mesh pattern MSP is disposed in the non-emission area NEM.

The pixels may include first color pixels (e.g., red pixels), second color pixels (e.g., blue pixels), and third color pixels (e.g., green pixels). For example, the first color pixels of the emission areas EMA_R may generate the red light, the second color pixels of the emission areas EMA_B may generate the blue light, and the third color pixels of the emission areas EMA_G may generate the green light. The shape of the emission areas EMA_R, EMA_G and EMA_B of the color pixels may be generally, for example, an octagon, a square or a diamond with rounded corners. It is, however, to be understood that the present disclosure is not limited thereto. For example, the shape of the emission areas EMA_R, EMA_G and EMA_B may be a circle, or other polygons with or without rounded corners.

In an embodiment of the present disclosure, the emission areas EMA_R of the first color pixels and the emission areas EMA_B of the second color pixels may have similar shapes such as a diamond shape with rounded corners. The emission areas EMA_B of the second color pixels may be larger than the emission areas EMA_R of the first color pixels.

The emission areas EMA_G of the third color pixels may be smaller than the emission areas EMA_R of the first color pixels. The emission area EMA_G of the third color pixel may have an octagon shape that is inclined in a diagonal direction and having the maximum width in the inclined direction. The emission areas EMA_G of the third color pixels may include emission areas EMA_G1 and emission areas EMA_G2. The emission areas EMA_G1 may be inclined in a first diagonal direction, and the emission areas EMA_G2 may be inclined in a second diagonal direction.

The emission areas EMA_R, EMA_G and EMA_B of the color pixels may be arranged in various ways. In an embodiment of the present disclosure, the emission areas EMA_R of the first color pixels and the emission areas EMA_B of the second color pixels may be alternately arranged in the second direction DR2 to form a first row, while the emission areas EMA_G: EMA_G1 and EMA_G2 of the third color pixels may be arranged in the second direction DR2 to form a second row next to the first row. The emission areas EMA_G: EMA_G1 and EMA_G2 of the third color pixels belonging to the second row may be arranged in a staggered manner in the second direction DR2 with respect to the emission areas EMA_R and EMA_B of the pixels belonging to the first row. In the second row, the emission areas EMA_G1 of the third color pixels that are inclined in the first diagonal direction and the emission areas EMA_G2 of the third color pixels that are inclined in the second diagonal direction may be alternately arranged in the second direction DR2.

In a third row, the emission areas EMA_R and EMA_B may be arranged in a manner the same as that of the first row but may be arranged in the alternating order. For example, in a column where the emission area EMA_R of the first color pixel is disposed in the first row, the emission area EMA_B of the second color pixel may be disposed in the third row of the same column. In a column where the emission area EMA_B of the second color pixel is disposed in the first row, the emission area EMA_R of the first color pixel may be disposed in the third row of the same column. In the fourth row, the emission areas EMA_G1 and EMA_G2 of the third color pixels are arranged like the second row but they may have different shapes inclined in different diagonal directions. For example, in a column where the emission area EMA_G1 of the third color pixel inclined in the first diagonal direction are disposed in the second row, the emission area EMA_G2 of the third color pixel inclined in the second diagonal direction may be disposed in the fourth row of the same column. In a column where the emission area EMA_G2 of the third color pixel inclined in the second diagonal direction is disposed in the second row, the emission area EMA_G1 of the third color pixel inclined in the first diagonal direction may be disposed in the fourth row of the same column.

The arrangement of the first to fourth rows may be repeated in the first direction DR1. It is to be understood that the arrangement of the emission areas EMA_R, EMA_B and EMA_G is not limited to the above example.

The mesh pattern MSP may be disposed along the boundaries of the pixels in the non-emission area NEM. The mesh pattern MSP may not overlap with the emission areas EMA_R, EMA_G and EMA_B. The mesh pattern MSP may be disposed in the non-emission area NEM when viewed from the top. In an embodiment of the present disclosure, mesh holes MHL exposed by the mesh pattern MSP may have a substantially diamond shape. The mesh holes MHL may have the same size. Alternatively, the mesh holes MHL may have different sizes either depending on the size of the emission areas EMA_R, EMA_G and EMA_B exposed via the mesh holes MHL or regardless of it. For example, in an embodiment of the present disclosure, each of the three types of mesh holes MHL of the first to three pixels may be proportional to the size of each of the three emission areas EMA_R, EMA_B and EMA_G, respectively. In this case, different from the mesh patterns MSP illustrated in a straight line between mesh holes MHL in FIG. 7, inflection points may be arranged in the mesh pattern MSP between mesh holes MHL. This is because the mesh pattens MSP define a plurality of different types of mesh holes MHL. Although a single mesh hole MHL is formed in each of the emission areas EMA_R, EMA_G and EMA_B in the drawing, this is merely illustrative. In an embodiment of the present disclosure, a single mesh hole MHL may be formed across two or more emission areas EMA_R, EMA_G and EMA_B.

Figure 8:
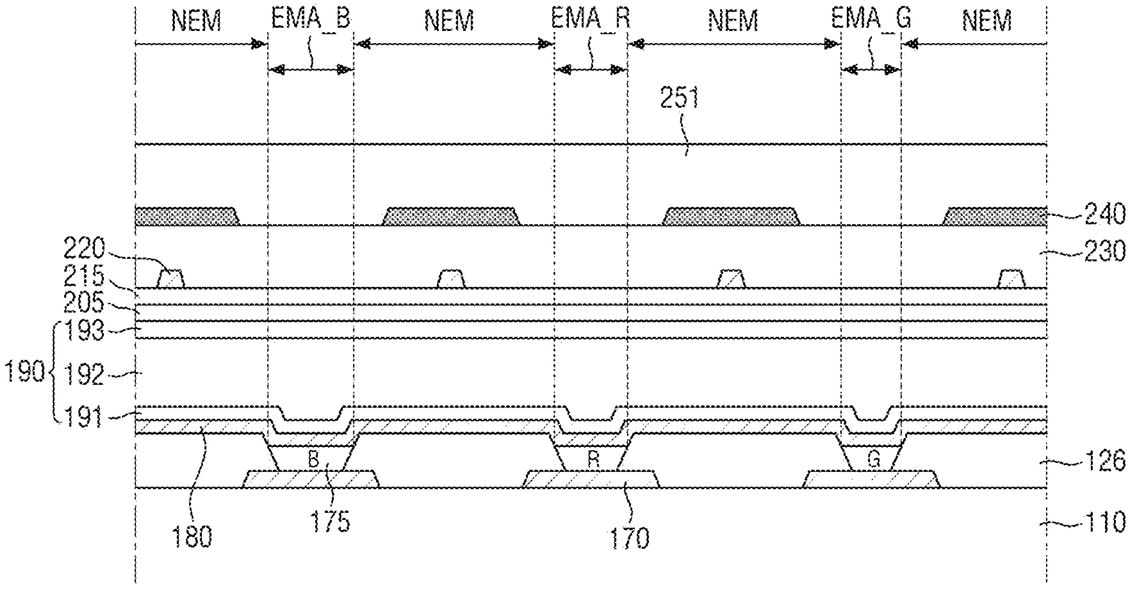
FIG. 8 is a cross-sectional view taken along line I-I' of FIG. 7.
Figure 9:
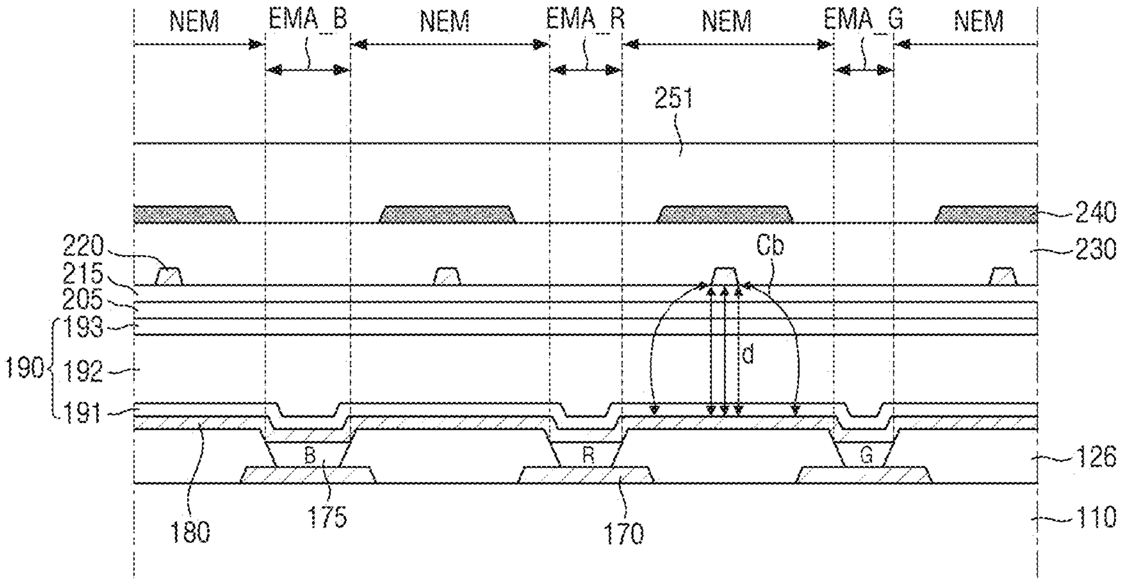
FIG. 9 is a view schematically showing a parasitic capacitance formed between the second touch conductive layer and the cathode electrode of FIG. 8.

FIG. 8 is a cross-sectional view taken along line I-I' of FIG. 7. FIG. 9 is a view schematically showing a parasitic capacitance formed between the second touch conductive layer and the cathode electrode of FIG. 8. In the cross-sectional view of FIG. 8 and the view of FIG. 9, most of the layers under an anode electrode 170 are not depicted and the structure above an organic light-emitting element is mainly shown.

Referring to FIG. 8, a substrate 110 of the display device 1 may be made of an insulating material such as a polymer resin. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The substrate 110 may have a single-layered or multi-layered structure including the above-described material. In the case of the multi-layered structure, the substrate 110 may further include an inorganic layer in addition to the layer including polymer resin. The substrate 110 may be a flexible substrate that can be bent, folded, or rolled. An example of the material of the flexible substrate may be, but is not limited to, polyimide (PI).

The anode electrode 170 is disposed on the substrate 110. The anode electrode 170 is disposed directly on the substrate 110 in the drawings for convenience of illustration. However, the circuit-driving layer DRL including a plurality of thin-film transistors and signal lines may be disposed between the substrate 110 and the anode electrode 170.

The anode electrode 170 may be a pixel electrode disposed in each of the pixels. The anode electrode 170 may have a stack structure of a material layer having a high work function such as, for example, indium tin oxide (ITO), indium zinc oxide (IZO), zinc oxide ($ZnO_2$) or indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Jr), chromium (Cr), lithium (Li), calcium (Ca) or a mixture thereof. The layer having a high work function may be disposed above the reflective material layer so that it is disposed closer to the organic layer 175. The anode electrode 170 may have, but is not limited to, a multilayer structure of indium tin oxide/magnesium (ITO/Mg), indium tin oxide/magnesium fluoride (ITO/$MgF_2$), indium tin oxide/silver (ITO/Ag), and indium tin oxide/silver/indium tin oxide (ITO/Ag/ITO).

A bank layer 126 may be disposed on the substrate 110. The bank layer 126 is disposed over the anode electrode 170 and may include an opening exposing the anode electrode 170. The bank layer 126 may be formed to separate the anode electrode 170 from another anode electrode 170, and may be formed to cover the edge of the anode electrode 170. The emission areas EMA_R, EMA_G and EMA_B and the non-emission area NEM may be defined by the bank layer 126 and the openings thereof. The bank layer 126 may include an organic insulating material such as, for example, polyacrylate resin, epoxy resin, phenolic resin, polyamide resin, polyimide resin, unsaturated polyesters resin, poly phenylene ether resin, poly phenylene sulfide resin, and benzocyclobutene (BCB). The bank layer 126 may include an inorganic material.

An emissive layer is disposed on the anode electrode 170 exposed via the bank layer 126. The emissive layer may include an organic layer 175. The organic layer 175 may include an organic light emitting layer and may further include a hole injecting/transporting layer and/or an electron injecting/transporting layer. In an embodiment of the present disclosure, the organic light emitting layer may include at least one of materials emitting red, green, or blue light, and may include a fluorescent material or a phosphorescent material.

A cathode electrode 180 may be disposed on the organic layer 175. The cathode electrode 180 may be a common electrode disposed across the pixels, and may provide a common voltage to the pixels. The anode electrode 170, the organic layer 175 and the cathode electrode 180 may form an organic light-emitting element. For example, when a voltage is applied to the first electrode (i.e., the anode electrode 170) and a cathode voltage is applied to the second electrode (i.e., the cathode electrode 180), the holes and electrons move to the organic light emitting layer of the organic layer 175, such that they combine in the organic light emitting layer to emit light.

The cathode electrode 180 may be in contact with the organic layer 175 as well as the upper surface of the bank layer 126. The cathode electrode 180 may be formed conformally to cover the underlying features to reflect the level differences of the underlying features.

The cathode electrode 180 may include a material layer having a small work function such as, for example, lithium (Li), calcium (Ca), lithium fluoride/calcium (LiF/Ca), lithium fluoride/aluminum (LiF/Al), aluminum (Al), magnesium (Mg), silver (Ag), platinum (Pt), palladium (Pd), nickel (Ni), gold (Au), neodymium (Nd), iridium (Jr), chromium (Cr), barium fluoride ($BaF_2$) or barium (Ba), or a compound or mixture thereof (e.g., a mixture of Ag and Mg). The cathode electrode 180 may further include a transparent metal oxide layer disposed on the material layer having a small work function.

A thin-film encapsulation layer 190 including a first inorganic film 191, an organic film 192 and a second inorganic film 193 is disposed on the cathode electrode 180. The thin-film encapsulation layer 190 may be disposed between the cathode electrode 180 and the base layer 205. In an embodiment of the present disclosure, the thin-film encapsulation layer 190 may have a structure in which the first inorganic film 191, the organic film 192, and the second inorganic film 193 are sequentially stacked on the cathode electrode 180. In an embodiment of the present disclosure, the second inorganic film 193 may be deposited to directly contact the first inorganic film 191 in an edge area of the display device, and thus the first inorganic film 191 and the second inorganic film 193 may seal the organic film 192 such that the organic film 192 is not exposed to the outside. Accordingly, external moisture or oxygen may be prevented or reduced from being infiltrated into the display area through the organic film 192.

Each of the first inorganic film 191 and the second inorganic film 193 may include, for example, silicon nitride ($Si_3N_4$), silicon oxide ($SiO_2$), silicon oxynitride (SiON), or the like.

As described above, to increase the touch sensitivity by the touch sensing in the unit sensing area SUT, it may be contemplated to reduce the capacitance between the first sensor portion SP1 and the second sensor portion SP2 and the conductive layers located under the second touch conductive layer 220 (see FIG. 6) in the unit sensing area SUT. For example, the first sensor portion SP1 and the second sensor portion SP2 as well as the cathode electrode 180 among the conductive layers located under the second touch conductive layer 220 which is closest to the second touch conductive layer 220 may have the greatest influence on the noise signal level of the touch sensitivity.

The capacitance Cb between the cathode electrode 180 and the second touch conductive layer 220 in the unit sensing area SUT (the first sensor portion SP1 and the second sensor portion SP2) may be inversely proportional to the distance d between the second touch conductive layer 220 and the cathode electrode 180 and may be proportional to the dielectric constant of the organic film 192. Materials with high dielectric constants can store more energy compared to those with low dielectric constants. That is, an increase in dielectric constant of the organic film 192 results in an increase in capacitance Cb, while an increase in the separation distance d between the cathode electrode 180 and the second touch conductive layer 220 results in a decrease in capacitance Cb. Therefore, to reduce the capacitance Cb between the cathode electrode 180 and the second touch conductive layer 220 in the unit sensing area SUT (the first sensor portion SP1 and the second sensor portion SP2), it may be contemplated to increase the distance d between the second touch conductive layer 220 and the cathode electrode 180 and/or to lower the dielectric constant of the organic film 192.

As described above with reference to FIG. 3, according to an embodiment of the present disclosure, the front transmittance of light emitted from the emissive layer EML can be enhanced by disposing the color filter layer CFL on the light-blocking pattern layer BML in the display device 1. However, when the distance d between the second touch conductive layer 220 and the cathode electrode 180 increases, the front transmittance of light emitted from the emissive layer EML may be lowered.

As shown in FIG. 8, the inorganic films 191 and 193, the organic film 192, the base layer 205 and the first touch insulating layer 215 are disposed between the second touch conductive layer 220 and the cathode electrode 180. Among the inorganic films 191 and 193, the organic film 192, the base layer 205 and the first touch insulating layer 215, the thickness of the organic film 192 may be greatest. Thus, the organic film 192 may provide the largest effect on the capacitance among the inorganic films 191 and 193, the organic film 192, the base layer 205 and the first touch insulating layer 215.

To reduce the capacitance Cb between the cathode electrode 180 and the second touch conductive layer 220 in the unit sensing area SUT (the first sensor portion SP1 and the second sensor portion SP2) without compromising the front transmittance of the light emitted from the emissive layer EML, it is desired to lower the dielectric constant of the organic film 192 having a relatively larger thickness.

According to an embodiment of the present disclosure, to reduce the capacitance Cb between the cathode electrode 180 and the second touch conductive layer 220 in the unit sensing area SUT (the first sensor portion SP1 and the second sensor portion SP2), the organic film 192 may have a dielectric constant approximately from 2.0 to 3.0. The organic film 192 contains organic molecules. Due to the characteristics of the organic film 192 containing the organic molecules, the dielectric constant of the organic film 192 may be equal to or greater than approximately 2.0. When the dielectric constant of the organic film 192 is equal to or less than approximately 3.0, it is possible to lower the capacitance value Cb between the cathode electrode 180 and the second touch conductive layer 220 (the first sensor portion SP1 and the second sensor portion SP2) in the unit sensing area SUT.

The dielectric constant of the organic film 192 is proportional to the number of organic molecules per unit volume in the organic film 192. Therefore, to reduce the dielectric constant of the organic film 192 to 3.0 or less, it is desired to lower the number of organic molecules per unit volume in the organic film 192. A scheme of lowering the number of organic molecules per unit volume in the organic film 192 will be described later with reference to FIGS. 10 and 11.

The base layer 205, the first touch insulating layer 215, the second touch conductive layer 220 and the second touch insulating layer 230 may be sequentially disposed on the thin-film encapsulation layer 190, for example, on the second inorganic film 193. The layers have been described above, and therefore, the redundant description will be omitted. FIGS. 8 and 9 are cross-sectional views of the sensor portion, and therefore, the first touch conductive layer 210 is not shown in the cross-sectional views.

The second touch conductive layer 220 may overlap with the bank layer 126 and may be disposed in the non-emission area NEM. The second touch conductive layer 220 forms the mesh pattern MSP of the sensor portions and does not interfere with emission of light and is not seen by a viewer because it does not overlap with the emission areas EMA_R, EMA_G and EMA_B.

A light-blocking pattern 240 is disposed on the second touch insulating layer 230. The light-blocking pattern 240 can suppress reflection of external light and may enhance the color of the reflected light. The light-blocking pattern 240 is disposed in the non-emission area NEM, and may have a lattice shape or a mesh shape when viewed from the top. The light-blocking pattern 240, the touch conductive layers 210 and 220 and the bank layer 126 are all disposed in the non-emission area NEM and overlap with one another in the thickness direction. The width of the light-blocking pattern 240 may be equal to or less than the width of the bank layer 126 and may be larger than the width of the touch conductive layers 210 and 220. The light-blocking pattern 240 may not overlap with the emission areas EMA_R, EMA_G and EMA_B.

An overcoat layer 251 is disposed on the light-blocking pattern 240, and may be disposed directly over the light-blocking pattern 240. The overcoat layer 251 covers and protects the light-blocking pattern 240. In an embodiment of the present disclosure, the overcoat layer 251 may also provide a flat surface.

Figure 10:
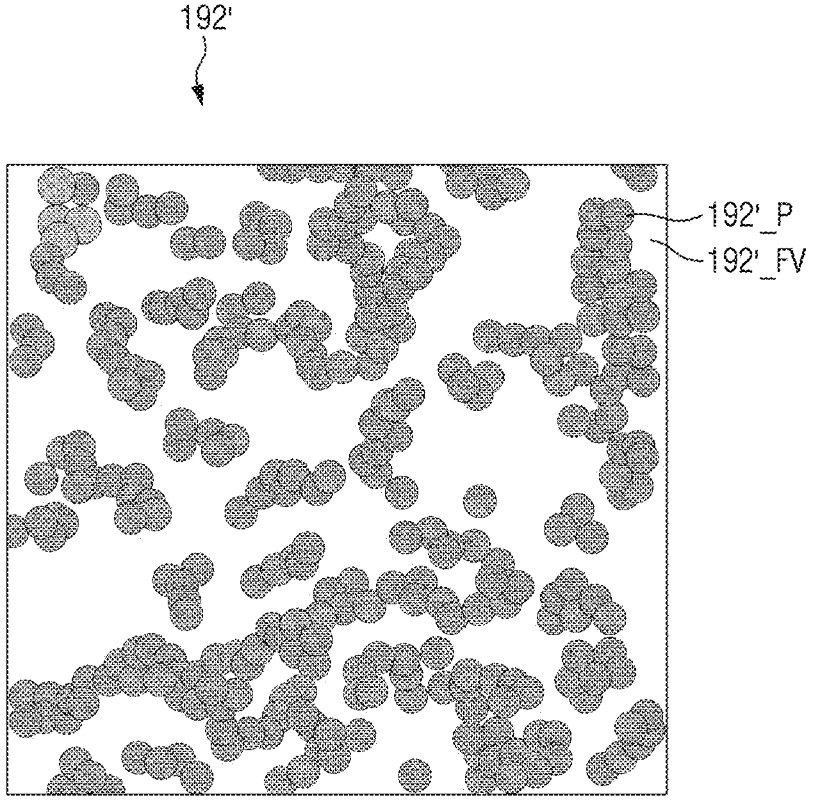
FIG. 10 is a view showing an organic film containing spherical organic molecules.
Figure 11:
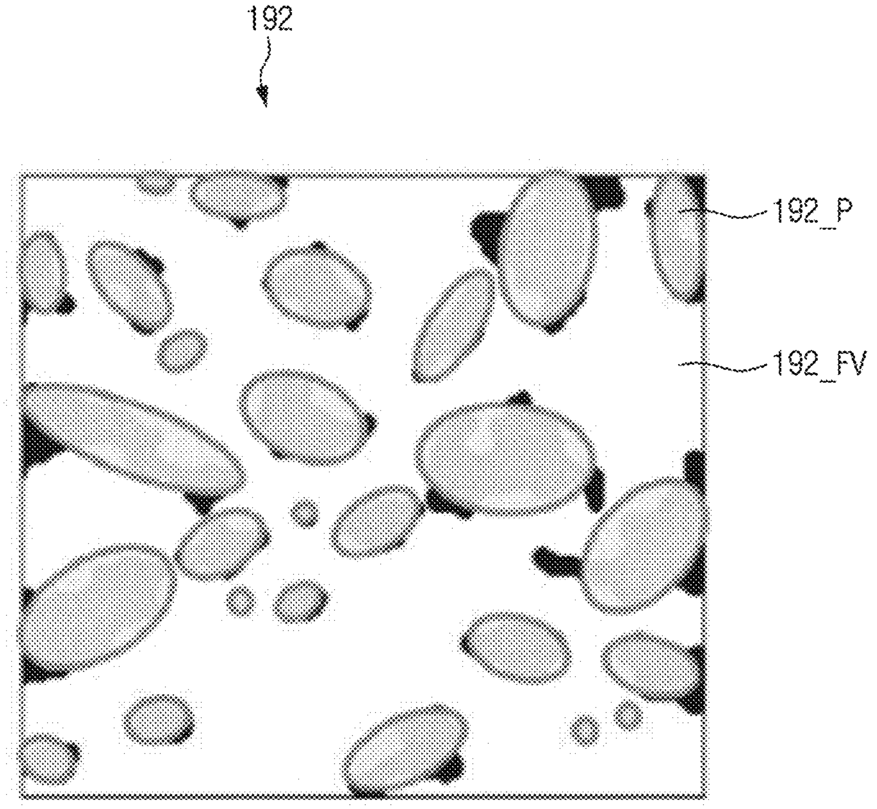
FIG. 11 is a view showing an organic film containing oval organic molecules according to an embodiment of the present disclosure.

FIG. 10 is a view showing an organic film containing spherical organic molecules. FIG. 11 is a view showing an organic film containing oval organic molecules according to an embodiment of the present disclosure.

Referring to FIGS. 10 and 11, as shown in FIG. 10, an organic film 192' may include spherical organic molecules 192'_P and a second space 192'_FV, and as shown in FIG. 11, the organic film 192 may include oval organic molecules 192_P and a first space 192_FV. The spherical organic molecules 192'_P of the organic film 192' have a spherical shape, and the oval organic molecules 192_P of the organic film 192 have an oval shape. The shape difference between the spherical organic molecules 192'_P and the oval organic molecules 192_P may be distinguished by measuring their absorbance at different angles using Fourier transform infrared spectrometer (FT-IR) to be described. The second space 192'_FV is a region excluding the spherical organic molecules 192'_P in the organic film 192', and may surround the spherical organic molecules 192'_P. The first space 192_FV is a region excluding the oval organic molecules 192_P in the organic film 192 and may surround the oval organic molecules 192_P.

The number of organic molecules 192_P per unit volume in the organic film 192 may be inversely proportional to the area of the first space 192_FV, and the number of organic molecules 192'_P per unit volume in the organic film 192' may be inversely proportional to the area of the second space 192'_FV.

The dielectric constant of the organic film 192 including the oval organic molecules 192_P and the first space 192_FV may be approximately 3.0 or less. On the other hand, the dielectric constant of the organic film 192' including the spherical organic molecules 192'_P and the second space 192'_FV may be greater than the dielectric const of the organic film 192. For example, the dielectric constant of the organic film 192' including the spherical organic molecules 192'_P and the second space 192'_FV may be equal to or greater than 3.1.

The reason why the dielectric constant of the organic film 192' is different from the dielectric constant of the organic film 192 is that the shapes of the organic molecules 192'_P and 192_P in the organic films 192' and 192 are different, and the number of organic molecules 192'_P and 192_P per unit volume in the organic films 192' and 192 varies depending on the shapes of the organic molecules 192'_P and 192_P. Typically, the dielectric constant of an organic film is proportional to the number of organic molecules per unit volume, and may be inversely proportional to the area of the space in the organic film excluding the organic molecules. For example, the dielectric constant of the organic film may be affected by the molecular polarizability of the organic molecules and/or the free volume associated with the organic molecules in the organic film. Since the dielectric constant of air is close to one, introducing free volume (porosity) to the organic film reduces its dielectric constant.

The number of organic molecules 192_P per unit volume of the organic film 192 having the oval organic molecules 192_P may be less than the number of organic molecules 192'_P per unit volume of the organic film 192' having the spherical organic molecules 1921P, and the area of the space 192_FV of the organic film 192 having the oval organic molecules 192_P may be greater than the area of the space 192'_FV of the organic film 192' having the spherical organic molecules 192'_P.

The shape of the oval organic molecules 192_P and the shape of the spherical organic molecules 192'_P can be clearly distinguished from each other by measuring absorbance using Fourier transform infrared spectrometer (FT-IR). That is, the oval shape according to the embodiment of the present disclosure can be distinguished from the spherical shape by measuring the absorbance using Fourier transform infrared spectrometer (FT-IR). This will be described in detail with reference to FIGS. 12 to 15.

Figure 12:
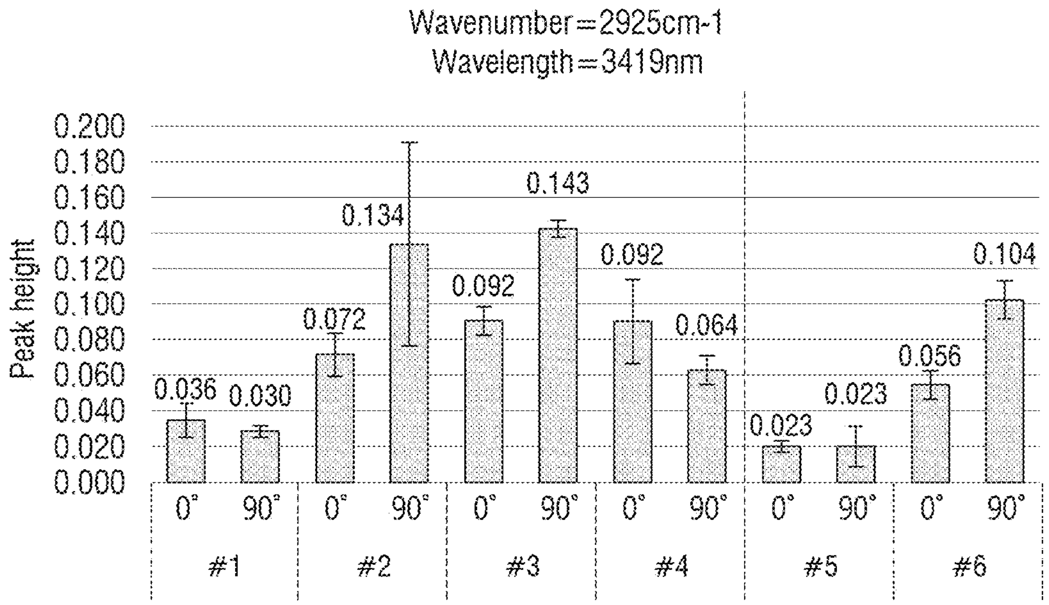
FIG. 12 is a view showing absorbance of organic molecules measured at 0 degrees and 90 degrees using Fourier transform infrared spectrometer (FT-IR) for each of Samples #1 to #6.
Figure 13:
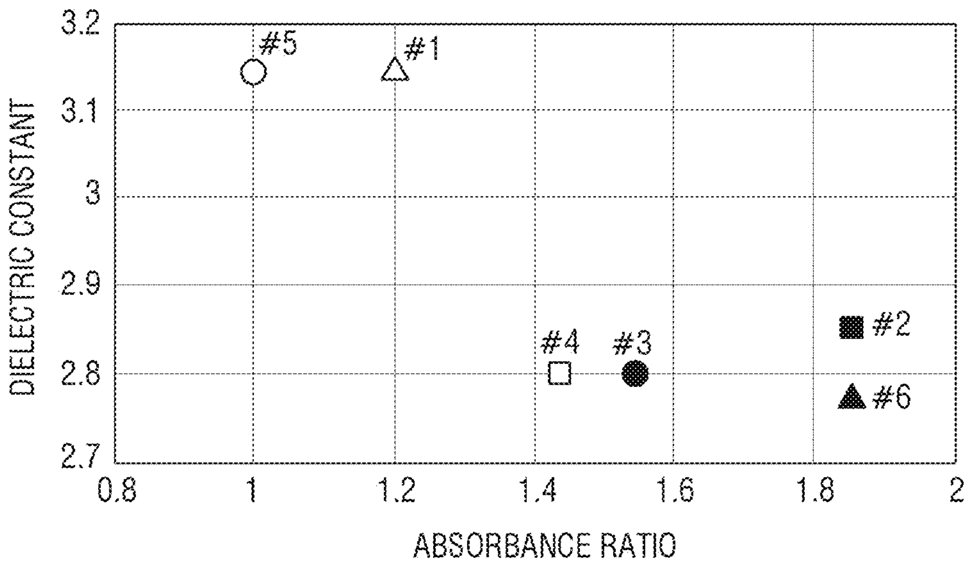
FIG. 13 is a graph showing an absorbance ratio between absorbance of organic molecules measured at 0 degrees and 90 degrees using the Fourier transform infrared spectrometer (FT-IR) of FIG. 12 for each of Samples #1 to #6.
Figure 14:
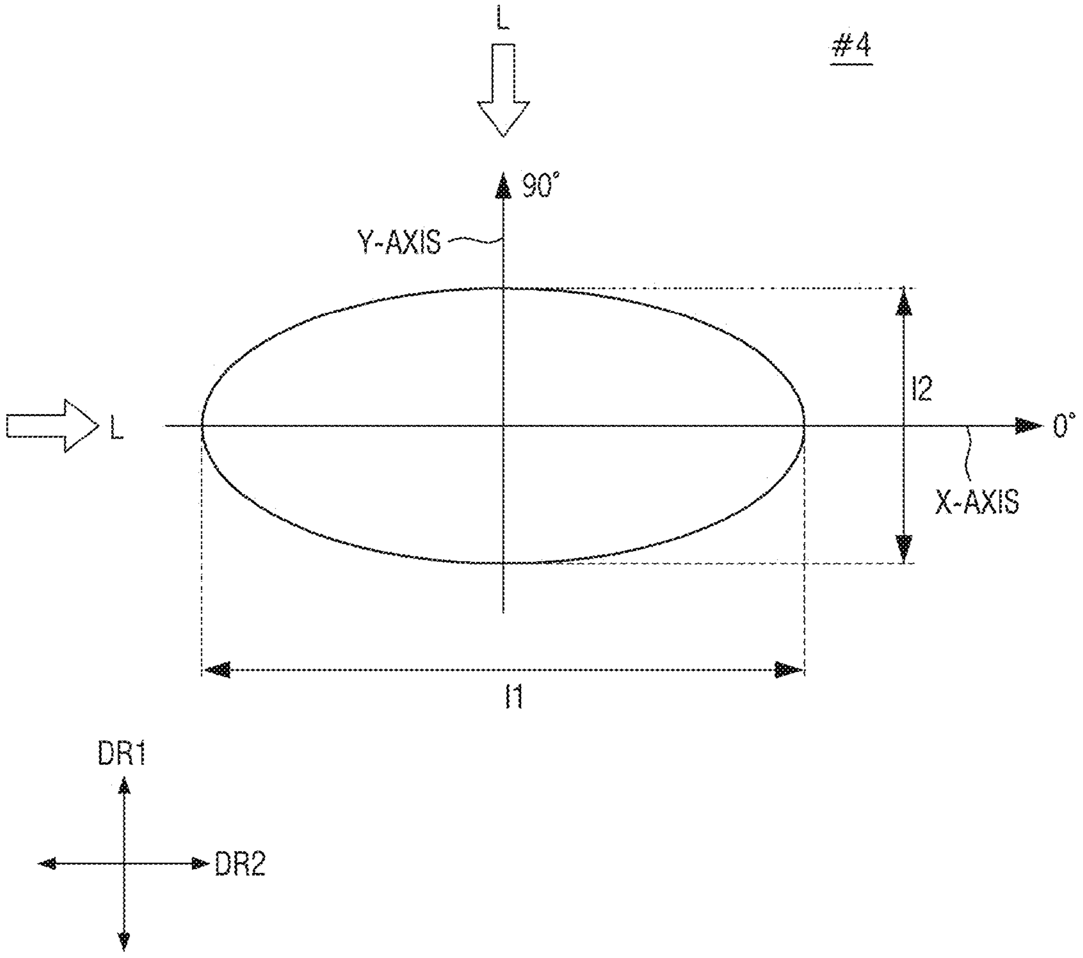
FIG. 14 is a view schematically showing the absorbance of organic molecules of Sample #4 of FIG. 12 measured using the Fourier transform infrared spectrometer (FT-IR)
Figure 15:
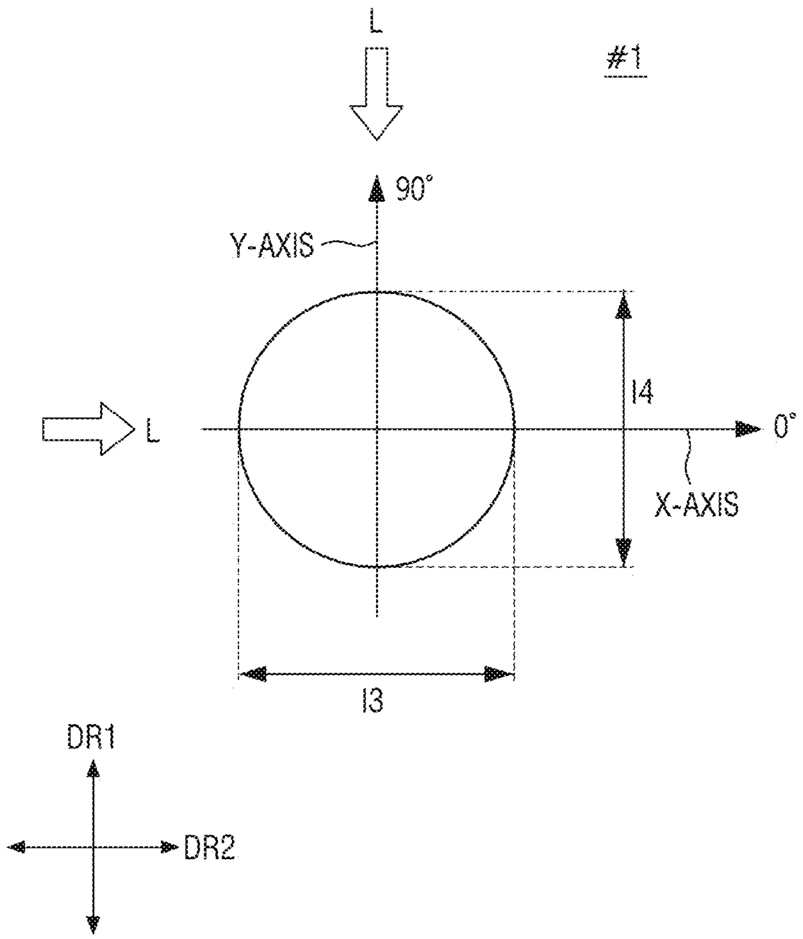
FIG. 15 is a view schematically showing the absorbance of organic molecules of Sample #1 of FIG. 12 measured using the Fourier transform infrared spectrometer (FT-IR)

FIG. 12 is a view showing the absorbance of organic molecules measured at 0 degrees and 90 degrees using Fourier transform infrared spectrometer (FT-IR) for each of Samples #1 to #6. FIG. 13 is a graph showing an absorbance ratio between the absorbance of organic molecules measured at 0 degrees and 90 degrees using the Fourier transform infrared spectrometer (FT-IR) for each of Samples #1 to #6 of FIG. 12. FIG. 14 is a view schematically showing the absorbance of organic molecules of Sample #4 of FIG. 12 measured using the Fourier transform infrared spectrometer (FT-IR). FIG. 15 is a view schematically showing the absorbance of organic molecules of Sample #1 of FIG. 12 measured using the Fourier transform infrared spectrometer (FT-IR). In FIG. 12, the horizontal axis represents angles of irradiating infrared light (L) in each sample, and the vertical axis represents the absorbance at different angles of irradiating infrared light (L) in each sample (e.g., each of Samples #1 to #6). Since the absorbance is proportional to a peak height as measurement results of the infrared spectrometer (FT-IR), the vertical axis represents the peak height in FIG. 12.

The absorbance of organic molecules may be measured using the Fourier transform infrared spectrometer (FT-IR) in a predetermined wavenumber range. The wavenumber may be the inverse of the wavelength. For example, the wavenumber range may be 2,850 $cm^{-1}$ to 2,950 $cm^{-1}$. By measuring the absorbance of organic molecules using the Fourier transform infrared spectrometer (FT-IR) in the wavenumber range of 2850 $cm^{-1}$ to 2950 $cm^{-1}$, the peak height for each sample can be precisely measured. In the example shown in FIG. 12, the absorbance of the organic molecules was measured at the wavenumber of 2,925 $cm^{-1}$ (or the wavelength is 3,419 nm).

In FIG. 13, the horizontal axis represents the absorbance ratio, and the vertical axis represents the dielectric constant of each sample (e.g., each of Samples #1 to #6). The absorbance ratio may be a value obtained by dividing the larger one by the smaller one between the absorbance measured at 0 degrees and the absorbance measured at 90 degrees.

In FIGS. 12 and 13, organic films in Sample #1 and Sample #5 include spherical organic molecules while organic films in Sample #2, Sample #3, Sample #4 and Sample #6 include oval organic molecules. For the samples (e.g., Sample #1 and Sample #5) including spherical organic molecules, the dielectric constants are larger than 3.0, and for the samples (e.g., Sample #2, Sample #3, Sample #4 and Sample #6) including oval organic molecules, the dielectric constants are smaller than 3.0. According to an embodiment of the present disclosure, to reduce the capacitance Cb between the cathode electrode 180 and the second touch conductive layer 220 in the unit sensing area SUT (the first sensor portion SP1 and the second sensor portion SP2), the organic film 192 of the thin-film encapsulation layer 190 may include the oval organic molecules having a dielectric constant approximately from 2.0 to 3.0.

As shown in FIGS. 14 and 15, absorbance of the organic molecules may be measured at 0 degrees and 90 degrees, respectively, using the Fourier transform infrared spectrometer (FT-IR). The x-axis and the y-axis are depicted in FIGS. 14 and 15. The x-axis may be the horizontal direction, and the y-axis may be the vertical direction perpendicular to the X axis, but the present disclosure is not limited thereto.

For convenience of illustration, only Sample #4 among the samples having oval organic molecules is shown in FIG. 14, and only Sample #1 among the samples having spherical organic molecules is shown in FIG. 15.

The absorbance of organic molecules is measured by irradiating the organic molecules with infrared light L from Fourier transform infrared spectrometer (FT-IR). For convenience of illustration, with respect to the x-axis direction, it is defined that the absorbance was measured at 0 degrees when infrared light L was incident on the organic molecules in the x-axis direction, and the absorbance was measured at 90 degrees when infrared light L was incident on the organic molecules in the y-axis direction For Sample #4, the longer axis of the oval organic molecule is the x-axis which has a first length l1, for example, and the shorter axis of the oval organic molecules is the y-axis which has a second length l2, for example. For example, the first length l1 is the major axis of the ellipse, and the second length l2 is the minor axis of the ellipse as shown in FIG. 14. In this case, the x-axis direction (the second direction DR2) is a longer axis direction, and the y-axis direction (the first direction DR1) is the shorter axis direction. The first length l1 is greater than the second length l2. For Sample #1, the spherical organic molecules are extended by a third length l3 along the x-axis and by a fourth length l4 along the y-axis. The third length l3 may be substantially equal to the fourth length l4.

Infrared light L is absorbed more as the length of the organic molecules passing in the irradiation direction is longer. Therefore, the longer the length of the organic molecules in the irradiation direction is, the higher the absorbance of infrared light L by the organic molecules is. As described above, for Sample #4, the longer axis of the oval organic molecule having the first length l1 is the x-axis, and the shorter axis of the oval organic molecule having the second length l2 is the y-axis. The absorbance of infrared light L by the organic molecules at 0 degrees may be greater than the absorbance of infrared light L by the organic molecules at 90 degrees. On the other hand, for Sample #1, since the third length l3 is substantially equal to the fourth length l4, the absorbance of infrared light L by the organic molecules at 0 degrees may be substantially equal to the absorbance of the infrared light L by the organic molecules at 90 degrees.

According to an embodiment of the present disclosure, when the absorbance ratio of an organic molecule is approximately 1.4 or more, the organic molecule may be regarded (or sorted) as an oval shape. For example, when the ratio between the absorbance of the organic molecules in the x-axis direction and the absorbance of the organic molecules in the y-axis direction is equal to or greater than 1.4, the dielectric constants of the organic molecules (e.g., the organic molecules in Sample #2, Sample #3, Sample #4 and Sample #6) are approximately from 2.0 to 3.0. According to an embodiment of the present disclosure, to reduce the capacitance Cb between the cathode electrode 180 and the second touch conductive layer 220 in the unit sensing area SUT (the first sensor portion SP1 and the second sensor portion SP2), the organic film 192 of the thin-film encapsulation layer 190 may include oval organic molecules having a ratio of an absorbance measured with a Fourier transform infrared spectrometer (FT-IR) at a wavenumber ranging from 2850 cm' to 2950 $cm^{-1}$ in the x-axis direction and an absorbance measured in the y-axis direction being equal to or greater than 1.4.

As shown in FIGS. 12 and 13, it may be regarded that the organic films include oval organic molecules in Sample #2 with the absorbance ratio of approximately 1.82, Sample #3 with the absorbance ratio of approximately 1.57, Sample #4 with the absorbance ratio of approximately 1.42 and Sample #6 with the absorbance ratio of approximately 1.82, while the organic films include spherical organic molecules in Sample #1 with the absorbance ratio of approximately 1.2 and Sample #5 with the absorbance ratio of approximately 1.0.

Referring back to FIG. 11, the organic film 192 according to an embodiment of the present disclosure may include an unsaturated polyester resin or a polyacrylate resin. For example, the organic molecules 192_P of the organic film 192 may have the following Chemical Formula 1 or Chemical Formula 2:

[Chemical Formula 1]

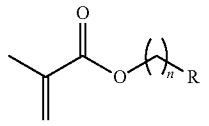

where n is a natural number equal to or greater than 12, and R denotes a methyl group or an acrylate group.

[Chemical Formula 2]

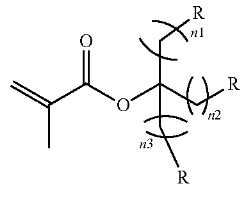

where each of n1, n2 and n3 is a natural number of 4 or more, and R denotes a methyl group or an acrylate group. It may include at least two of three (n1, n2 and n3) alkyl chains, for example, may include the alkyl chains having n1 and n2, n1 and n3, n2 and n3, or n1, n2, and n3 methylene groups. For example, in Chemical Formula 2, the alkyl chain having n1 methylene groups, $—(CH_2)_{n1}—R$, may be replaced with a hydrogen (H), the alkyl chain having n2 methylene groups, $—(CH_2)_{n2}—R$, may be replaced with a hydrogen (H), the alkyl chain having n3 methylene groups, $—(CH_2)_{n3}—R$, may be replaced with a hydrogen (H), or none of the alkyl chains may be replaced with a hydrogen (H).

As the organic molecule 192_P has Chemical Formula 1, the number of carbons increases, and thus the chain length of the organic molecule 192_P increases, so that the shape of the organic molecule 192_P can be changed to an oval shape.

In addition, since the organic molecule 192_P has Chemical Formula 2, the organic molecule 192_P may have a functional group having a large volume. As a result, the overall volume of the organic molecules 192_P can be increased, thereby reducing the number of organic molecules 192_P per unit volume in the organic film 192.

In an embodiment of the present disclosure, the organic molecules 192_P of the organic film 192 may have one or both of Chemical Formula 1 and Chemical Formula 2. For example, in the composition of the organic molecules 192_P, some molecules may have Chemical Formula 1 and some molecules may have Chemical Formula 2. That is, the organic molecules 192_P may also be a mixture of molecules of Chemical Formula 1 and molecules of Chemical Formula 2.

As described above, according to an embodiment of the present disclosure, the dielectric constant of the organic film 192 can be lowered without increasing the thickness of the organic film 192 as the organic molecules 192_P of the organic film 192 have the oval shape. The organic molecules 192_P having the oval shape may also be referred to as oval organic molecules. Accordingly, the capacitance Cb between the cathode electrode 180 and the second touch conductive layer 220 (the first sensor portion SP1 and the second sensor portion SP2) in the unit sensing area SUT may be reduced without compromising the front transmittance of the light emitted from the emissive layer EML. As a result, the touch sensitivity may be enhanced.

Figure 16:
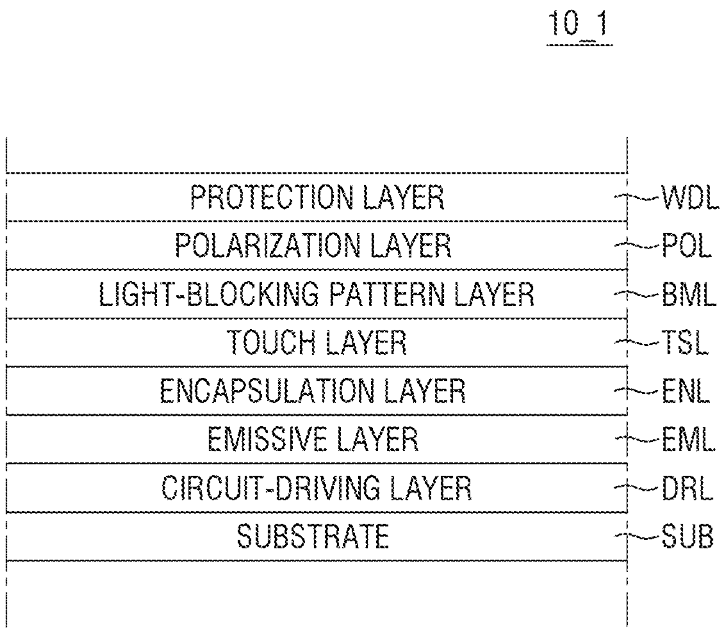
FIG. 16 is a cross-sectional view showing a part of a display device according to an embodiment of the present disclosure.

FIG. 16 is a cross-sectional view showing a part of a display device according to an embodiment of the present disclosure.

A display panel 10_1 according to the embodiment of FIG. 16 is substantially identical to the display panel 10 of FIG. 3 except that the color filter layer CFL of the display panel 10 is eliminated and a polarization layer POL is disposed in place of the color filter layer CFL.

The polarization layer POL may be disposed on the light-blocking pattern layer BML to reduce reflection of external light. The polarization layer POL may be attached on the light-blocking pattern layer BML by an adhesive layer. A protective layer WDL may be disposed on the polarization layer POL.

According to this embodiment, the front transmittance of light emitted from the emissive layer EML may be reduced compared to the display panel 10 of FIG. 3 in which the color filter layer CFL is disposed on the light-blocking pattern layer BML. However, as described above with reference to FIGS. 8 and 11, the dielectric constant of the organic film 192 can be lowered as the organic molecules 192_P of the organic film 192 have the oval shape, and thus the capacitance Cb between the cathode electrode 180 and the second touch conductive layer 220 (the first sensor portion SP1 and the second sensor portion SP2) in the unit sensing area SUT is not significantly increased even though the thickness of the organic film 192 is reduced to compensate for the reduced front transmittance of the light due to the presence of the polarization layer POL. As a result, the touch sensitivity may be appropriately maintained or the touch sensitivity may be enhanced.

Although specific embodiments of the present disclosure have been disclosed for illustrative purposes, those skilled in the art will appreciate that various modifications, additions and substitutions are possible, without departing from the scope and spirit of the present disclosure as defined in the appended claims.

What is claimed is:

1. A display device comprising:

a substrate;

a first electrode disposed on the substrate;

a bank layer disposed on the substrate and comprising an opening exposing the first electrode;

an emissive layer disposed on the first electrode exposed by the bank layer;

a second electrode disposed on the bank layer and the emissive layer;

an encapsulation layer disposed on the second electrode; and a touch layer disposed on the encapsulation layer, wherein the encapsulation layer comprises at least one inorganic film and at least one organic film, and wherein the organic film contains a first organic molecule and a second organic molecule, wherein the organic film has a dielectric constant approximately from 2.0 to 3.0, wherein the first organic molecule has a following formula (1):

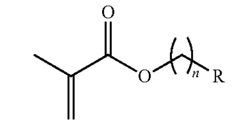

where n is a natural number equal to or greater than 12, and R denotes a methyl group or an acrylate group, and wherein the second organic molecule has a following formula (2):

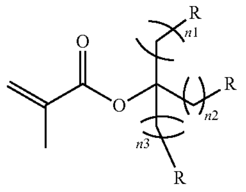

where at least two of n1, n2 and n3 are each independently a natural number of 4 or more, and any remainder thereof is hydrogen, and R denotes a methyl group or an acrylate group.

2. The display device of claim 1, further comprising:

a color filter layer disposed on the touch layer.

3. A display device comprising:

a substrate;

a first electrode disposed on the substrate;

a bank layer disposed on the substrate and comprising an opening exposing the first electrode;

an emissive layer disposed on the first electrode exposed by the bank layer;

a second electrode disposed on the bank layer and the emissive layer;

an encapsulation layer disposed on the second electrode; and a touch layer disposed on the encapsulation layer, wherein the encapsulation layer comprises at least one inorganic film and at least one organic film, wherein the organic film has a dielectric constant approximately from 2.0 to 3.0, wherein the organic film contains organic molecules having one or both of formula (1) and formula (2), wherein the formula (1) is:

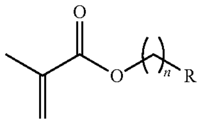

where n is a natural number equal to or greater than 12, and R denotes a methyl group or an acrylate group, wherein the formula (2) is:

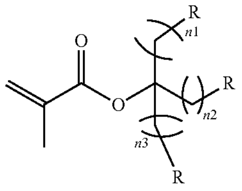

where at least two of n1, n2 and n3 are each independently a natural number of 4 or more, and any remainder thereof is hydrogen, and R denotes a methyl group or an acrylate group.

4. An electronic device comprising:

a substrate;

a first electrode disposed on the substrate;

a bank layer disposed on the substrate and comprising an opening exposing the first electrode;

an emissive layer disposed on the first electrode exposed by the bank layer;

a second electrode disposed on the bank layer and the emissive layer;

an encapsulation layer disposed on the second electrode; and a touch layer disposed on the encapsulation layer, wherein the encapsulation layer comprises at least one inorganic film and at least one organic film, wherein the organic film has a dielectric constant approximately from 2.0 to 3.0, wherein the organic film contains organic molecules having one or both of formula (1) and formula (2), wherein the formula (1) is:

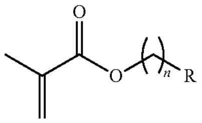

where n is a natural number equal to or greater than 12, and R denotes a methyl group or an acrylate group, wherein the formula (2) is:

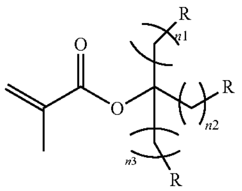

where at least two of n1, n2 and n3 are each independently a natural number of 4 or more, and any remainder thereof is hydrogen, and R denotes a methyl group or an acrylate group.

5. The display device of claim 3, wherein the encapsulation layer comprises a first inorganic film disposed on the second electrode, an organic film disposed on the first inorganic film, and a second inorganic film disposed on the organic film.

6. The display device of claim 3, wherein the touch layer comprises a first touch conductive layer and a second touch conductive layer, and further comprises a first touch insulating layer disposed between the first touch conductive layer and the second touch conductive layer, and wherein the first touch conductive layer is disposed between the second inorganic film and the first touch insulating layer.

7. The display device of claim 6, further comprising:

a color filter layer disposed on the touch layer.

8. The display device of claim 6, further comprising:

a polarization layer disposed on the touch layer.

9. The display device of claim 1, wherein the organic film has a dielectric constant approximately from 2.0 to 3.0.

10. The display device of claim 1, wherein the encapsulation layer comprises a first inorganic film disposed on the second electrode, an organic film disposed on the first inorganic film, and a second inorganic film disposed on the organic film.

11. The display device of claim 10, wherein the touch layer comprises a first touch conductive layer and a second touch conductive layer, and further comprises a first touch insulating layer disposed between the first touch conductive layer and the second touch conductive layer, and wherein the first touch conductive layer is disposed between the second inorganic film and the first touch insulating layer.

* * * * *